United States Patent
Shin et al.

(10) Patent No.: US 8,107,586 B2
(45) Date of Patent: Jan. 31, 2012

(54) SHIFT REGISTER AND DISPLAY DEVICE INCLUDING THE SAME

(75) Inventors: Kyong-Ju Shin, Yongin-si (KR);
Chong-Chul Chae, Seoul (KR);
Mun-Pyo Hong, Seongnam-si (KR);
Cheol-Woo Park, Suwon-si (KR);
Nam-Seok Roh, Sungnam-si (KR)

(73) Assignee: Samsung Electronics Co., Ltd. (KR)

( * ) Notice: Subject to any disclaimer, the term of this patent is extended or adjusted under 35 U.S.C. 154(b) by 119 days.

(21) Appl. No.: 11/078,985

(22) Filed: Mar. 11, 2005

(65) Prior Publication Data

US 2005/0201508 A1   Sep. 15, 2005

(30) Foreign Application Priority Data

Mar. 12, 2004   (KR) .................. 10-2004-0016812

(51) Int. Cl.
*G11C 19/00* (2006.01)

(52) U.S. Cl. ............... 377/64; 377/68; 377/69; 377/78; 377/79

(58) Field of Classification Search .................. None
See application file for complete search history.

(56) References Cited

U.S. PATENT DOCUMENTS

| | | | | |
|---|---|---|---|---|
| 5,093,655 A * | 3/1992 | Tanioka et al. | ............... | 345/96 |
| 5,517,543 A * | 5/1996 | Schleupen et al. | ............... | 377/79 |
| 5,859,630 A * | 1/1999 | Huq | ............... | 345/100 |
| 5,909,247 A * | 6/1999 | Hosokai et al. | ............... | 348/302 |
| 5,949,398 A * | 9/1999 | Kim | ............... | 345/100 |
| 6,295,046 B1 | 9/2001 | Hebiguchi | | |
| 6,300,928 B1 * | 10/2001 | Kim | ............... | 345/92 |
| 6,426,743 B1 | 7/2002 | Yeo et al. | | |
| 6,515,647 B1 * | 2/2003 | Sakamoto | ............... | 345/99 |
| 6,545,653 B1 * | 4/2003 | Takahara et al. | ............... | 345/87 |
| 6,556,646 B1 * | 4/2003 | Yeo et al. | ............... | 377/54 |
| 6,611,248 B2 * | 8/2003 | Kanbara et al. | ............... | 345/100 |
| 6,813,332 B2 * | 11/2004 | Nagao et al. | ............... | 377/79 |
| 6,919,874 B1 * | 7/2005 | Maurice | ............... | 345/100 |
| 7,050,036 B2 * | 5/2006 | Kim et al. | ............... | 345/100 |
| 7,145,545 B2 * | 12/2006 | Zebedee et al. | ............... | 345/100 |
| 7,203,410 B2 * | 4/2007 | Wei et al. | ............... | 385/137 |
| 7,327,343 B2 * | 2/2008 | Lu et al. | ............... | 345/100 |
| 7,369,111 B2 * | 5/2008 | Jeon et al. | ............... | 345/100 |
| 7,907,113 B2 * | 3/2011 | Jang et al. | ............... | 345/100 |
| 2002/0003964 A1 * | 1/2002 | Kanbara et al. | ............... | 396/661 |
| 2002/0150199 A1 * | 10/2002 | Sasaki et al. | ............... | 377/64 |
| 2003/0042104 A1 * | 3/2003 | Matsufuji et al. | ............ | 192/87.11 |
| 2003/0058234 A1 | 3/2003 | Kanzaki et al. | | |
| 2004/0109526 A1 * | 6/2004 | Park et al. | ............... | 377/64 |

(Continued)

FOREIGN PATENT DOCUMENTS

JP        04-116588        4/1992

(Continued)

*Primary Examiner* — Tuan T Lam
(74) *Attorney, Agent, or Firm* — Cantor Colburn LLP

(57) ABSTRACT

A shift register comprises stages connected to each other, in which each stage generates an output signal in response to any one of clock signals and an output from each of two different stages. Each clock signal has a duty ratio of less than 50% and a different phase from each of the other clock signals. A display device includes pixels, signal lines, and first and second shift registers each having stages connected to each other and generating output signals to signal lines. Each stage includes a set terminal, a reset terminal, a clock terminal, and first and second output terminals.

21 Claims, 15 Drawing Sheets

U.S. PATENT DOCUMENTS

| | | | |
|---|---|---|---|
| 2004/0125069 A1* | 7/2004 | Park et al. | 345/100 |
| 2004/0165692 A1* | 8/2004 | Moon et al. | 377/64 |
| 2004/0218710 A1* | 11/2004 | Shih et al. | 377/64 |
| 2004/0234020 A1* | 11/2004 | Yu | 377/64 |
| 2006/0013352 A1* | 1/2006 | Lin et al. | 377/78 |
| 2006/0187175 A1* | 8/2006 | Lo et al. | 345/100 |

FOREIGN PATENT DOCUMENTS

| | | |
|---|---|---|
| JP | 07-140439 | 6/1995 |
| JP | 08-062580 | 3/1996 |
| JP | 08-146910 | 6/1996 |
| JP | 08-305325 | 11/1996 |
| JP | 08-334740 | 12/1996 |
| JP | 09-114423 | 5/1997 |
| JP | 09-153296 | 6/1997 |
| JP | 2000-155550 | 6/2000 |
| JP | 2001-195043 | 7/2001 |
| JP | 2002-008388 | 1/2002 |
| JP | 2002-133890 | 5/2002 |
| JP | 2003076346 | 3/2003 |
| JP | 2003-099019 | 4/2003 |
| KR | 1020000055633 | 9/2000 |
| KR | 10-0278121 | 6/2007 |

* cited by examiner

SHIFT REGISTER AND DISPLAY DEVICE INCLUDING THE SAME

BACKGROUND OF THE INVENTION (a) Field of the Invention

The present invention relates to a display device for displaying images, and more particularly to a shift register for driving an image display device and a display device including the same.

(b) Description of Related Art

Recently, a wide variety of flat panel displays have been developed such as organic electroluminescence displays (OLEDs), plasma display panels (PDPs) and liquid crystal displays (LCDs) instead of heavy and large cathode ray tubes (CRTs).

The PDPs are devices which display characters or images using plasma generated by a gas-discharge. The OLEDs are devices which display characters or images by applying an electric field to specific light-emitting organics or high molecule materials. The LCDs are devices which display images by applying an electric field to a liquid crystal layer disposed between two panels and regulating the strength of the electric field to adjust a transmittance of light passing through the liquid crystal layer.

Of these flat panel displays, for example, the LCDs and the OLEDs each include a panel unit provided with pixels including switching elements and display signal lines, and a gate driver, i.e., a shift register providing a gate signal for gate lines of the display signal lines to turn on/off the switching elements. The shift register is comprised of a plurality of stages. Each of the stages includes a plurality of NMOS or PMOS transistors comprising an input unit, an output unit, a pull-up driving unit and pull-down driving unit.

A first stage outputs the gate signal synchronized with a clock signal in response to a vertical synchronization start signal, and remaining stages, including a second stage, output the gate signal synchronized with the clock signal in response to gate outputs of previous and next stages.

The shift register described above has a reliability problem during low temperature driving. During low temperature driving at about 20 degrees below zero, drain currents of transistors of each stage decrease due to characteristics of semiconductor material used to make the transistors. Thus, retardation occurs, which is a phenomenon characterized by an increase in time taken for an output level of the transistors of the output unit to rise to a desired level. Additionally, resistive-capacitive (RC) delay due to resistances and parasitic capacitances of the gate lines adds to the impact of retardation. Such impact of retardation can affect next stages causing a gate block defect of not turning on the switching elements of a portion of the pixels.

SUMMARY OF THE INVENTION

The present invention provides a shift register and a display device including the same capable of implementing high reliability and high resolution.

In an exemplary embodiment, a shift register includes a plurality of stages connected to each other, wherein each of the stages generates an output signal in response to any one of a plurality of clock signals and an output from each of two different stages, each of the clock signals having a duty ratio of less than 50% and a different phase from each of the other clock signals.

Each of the stages may include a driving unit charging to a predetermined voltage in response to either an output start signal or an output signal of a previous stage and generating the output signal in response to any one of the clock signals; and a discharge unit discharging the charged predetermined voltage in response to an output signal of a next stage.

The driving unit may include an input unit which outputs a first voltage in response to either an output start signal or an output signal of a previous stage; and an output unit charging to a first voltage and generating the output signal in response to any one of the clock signals. The discharge unit may output a second voltage to the output unit in response to the output signal of the next stage to discharge from the first voltage to the second voltage. The output unit may output the second voltage as the output signal. In this case, the output unit may include two output circuits having substantially the same structure.

Each stage may further include an output assistant unit transmitting the first voltage to the output unit in response to an output of the input unit. In addition, each stage has a set terminal, a reset terminal, and first and second terminals, and the input unit may include a first switching element connected between the first voltage and a first point of contact and having a control terminal connected to the set terminal.

The output assistant unit may include a second switching element connected between the first voltage and a second point of contact; and a third and a fourth switching elements connected in series between the first voltage and the second voltage. A control terminal of the second switching element may be connected to a point of contact between the third and the fourth switching elements.

The discharge unit may include a fifth and a sixth switching elements connected in parallel between the first point of contact and the second voltage; and a seventh and a eighth switching elements connected in parallel between the second point of contact and the second voltage. A control terminal of the fifth switching element is connected to the reset terminal, and a control terminal of the sixth switching element is connected to the second point of contact, and a control terminal of the seventh switching element is connected to the first point of contact, and a control terminal of the eighth switching element is connected to the set terminal.

The output unit may include ninth to twelfth switching elements, in which the ninth and tenth switching elements are connected in series between the clock terminal and the second voltage, and the eleventh and twelfth switching elements are connected in series between the clock terminal and the second voltage; and first and second capacitors connected between the first point of contact and the first and second output terminals, respectively. Control terminals of the ninth and the eleventh switching elements are connected to the first point of contact and control terminals of the tenth and the eleventh switching elements are connected to the second point of contact.

In this case, the first output terminal is connected to a point of contact between the ninth switching element and the tenth switching element, and the second output terminal is connected to a point of contact between the eleventh and twelfth switching elements. The first to twelfth switching elements may comprise amorphous silicon.

The shifter register may include first and second register units, in which the first register unit may include first register unit stages each of which is connected to a corresponding odd signal line, and the second register unit includes second register unit stages each of which is connected to a corresponding even signal line. Each of the first register unit stages may be connected to two different first register unit stages, and each of the second register unit stages may be connected to two different second register unit stages.

Each of the first and second register unit stages may have a first output terminal connected to an external unit and a second output terminal connected to another one of the first and second register unit stages. Each of the first and second register unit stages may have a set terminal and a reset terminal receiving an output from different ones of the first and second register unit stages. An initial first register unit stage in the first register unit and an initial second register unit stage in the second register unit each may receive separate output start signals having a predetermined time interval.

The clock signals may include first and second clock signals applied to the first register unit and third and fourth clock signals applied to the second register unit, and the first, second, third and fourth clock signals may have a duty ratio of 25% and a phase difference of 90 degrees, sequentially, and falling edges and rising edges of adjacent clock signals preferably correspond.

In another embodiment, a display device includes pixels each comprising a switching element; signal lines connected to each switching element; and first and second shift registers comprising first shift register stages and second shift register stages, respectively, the first and second shift register stages being connected to each other and generating output signals for application to the signal lines. Each of the first and second shift register stages may have a set terminal, a reset terminal, a clock terminal and first and second output terminals. The set terminal may be connected to a different stage second output terminal of another stage belonging to a same shift register, and the reset terminal is connected to another different stage second output terminal of still another stage belonging to the same shift register. The clock terminal may be applied with one of clock signals, and the first output terminal may be connected to one of the signal lines.

The first shift register may be connected to odd signal lines and the second shift register may be connected to even signal lines. The clock signals may have a duty ratio of 25% and each have a different phase from each other one of the clock signals. An initial first shift register stage in the first shift register and an initial second shift register stage in the second shift registers may each receive first and second output start signals, respectively, and the second output start signal may be delayed by 1 H relative to the first output start signal.

BRIEF DESCRIPTION OF THE DRAWINGS

The present invention will become more apparent by describing preferred embodiments thereof in detail with reference to the accompanying drawings in which.

DETAILED DESCRIPTION OF EMBODIMENTS

Figure 1:
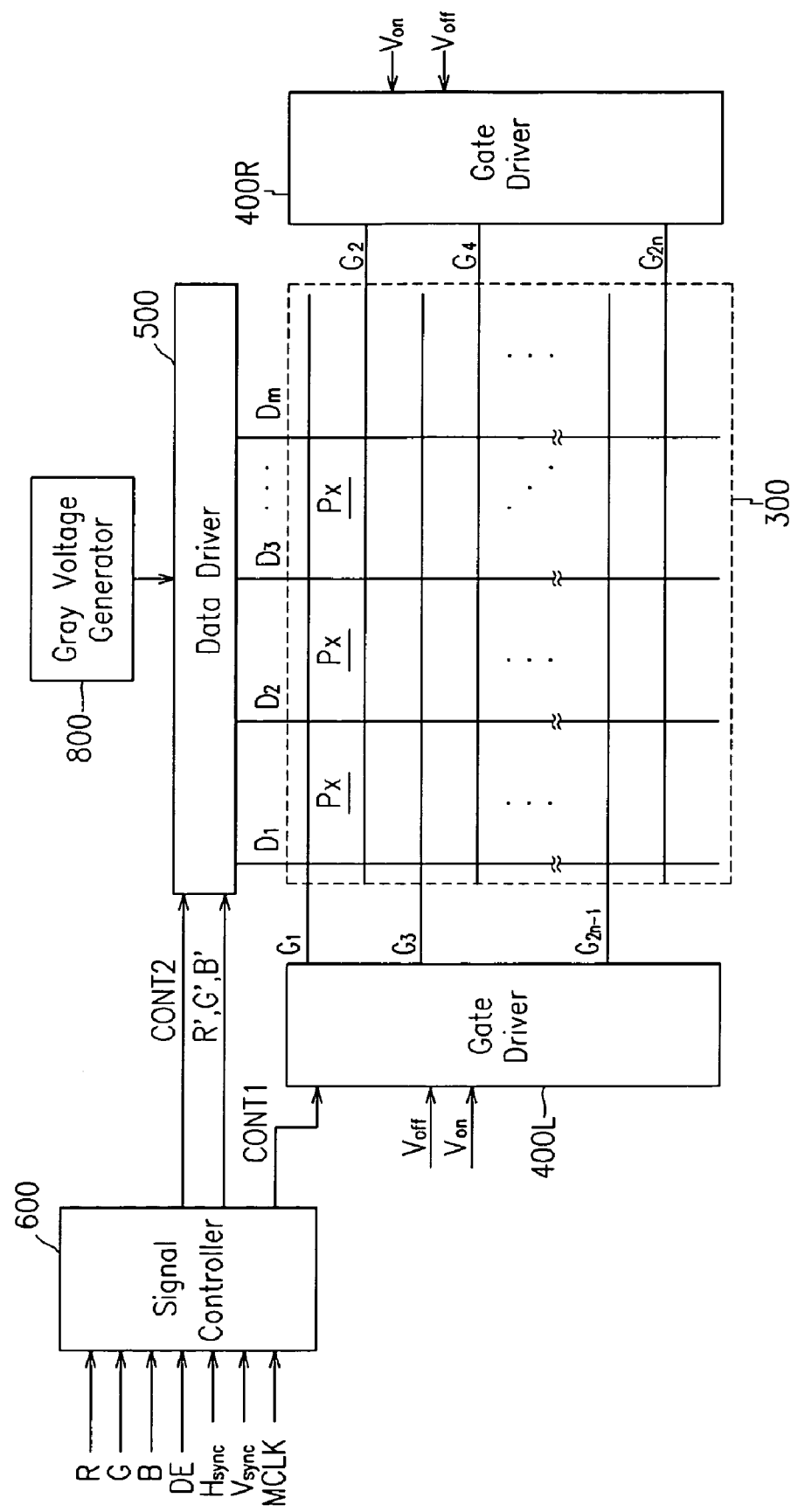
FIG. 1 is a block diagram of a display device according to an exemplary embodiment of the present invention.

The present invention now will be described more fully hereinafter with reference to the accompanying drawings, in which preferred embodiments of the invention are shown. This invention may, however, be embodied in many different forms and should not be construed as being limited to the embodiments set forth herein.

In the drawings, the thickness of layers and regions are exaggerated for clarity. Like numerals refer to like elements throughout. It will be understood that when an element such as a layer, film, region, substrate or panel is referred to as being "on" another element, it can be directly on the other element or intervening elements may also be present. In contrast, when an element is referred to as being "directly on" another element, there are no intervening elements present.

Figure 2:
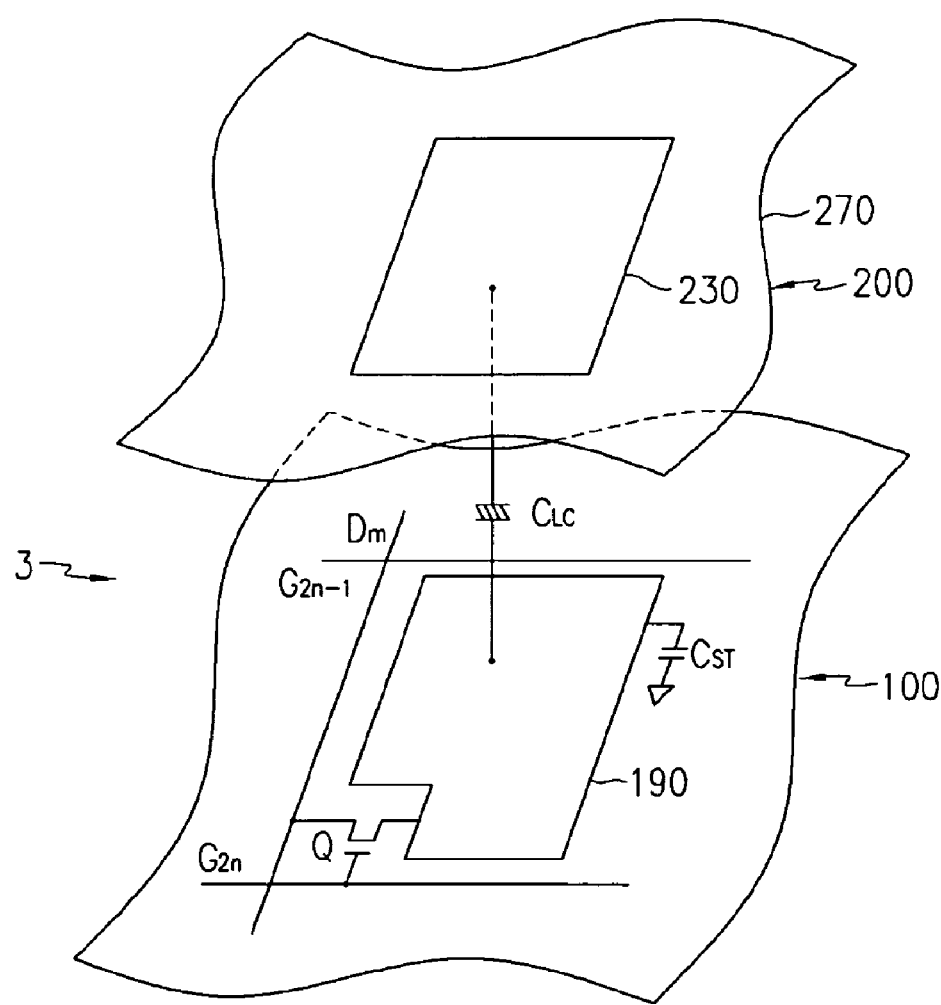
FIG. 2 is an equivalent circuit diagram of a pixel of a liquid crystal display according to an exemplary embodiment of the present invention.
Figure 3:
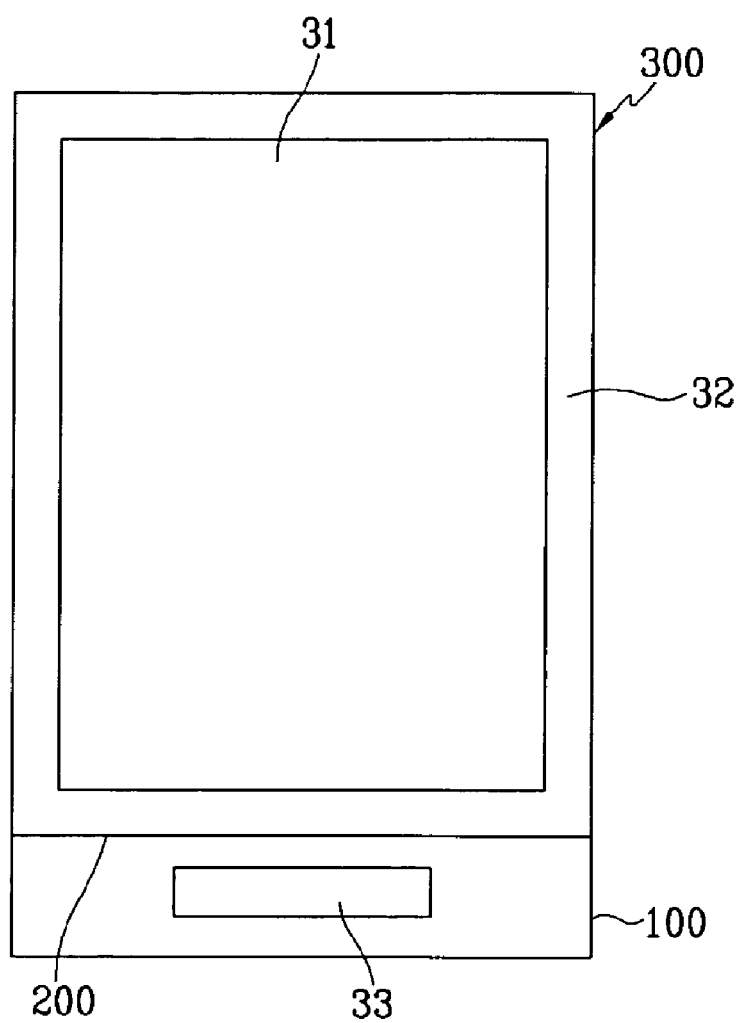
FIG. 3 is a schematic view of a display device according to an exemplary embodiment of the present invention.

FIG. 1 is a block diagram of a display device according to an exemplary embodiment of the present invention, and FIG. 2 is an equivalent circuit diagram of a pixel of a liquid crystal display (LCD) according to an exemplary embodiment of the present invention, and FIG. 3 is a schematic view of a display device according to an exemplary embodiment of the present invention.

Referring to FIGS. 1-3, the panel assembly 300 includes a plurality of display signal lines $G_1$-$G_{2n}$ and $D_1$-$D_m$ and a plurality of pixels connected to the display signal lines $G_1$-$G_{2n}$ and $D_1$-$D_m$ and arranged substantially in a matrix structure. The panel assembly 300 includes a lower panel 100 and an upper panel 200.

The display signal lines $G_1$-$G_{2n}$ and $D_1$-$D_m$ are provided on the lower panel 100 and include gate lines $G_1$-$G_{2n}$ transmitting gate signals (called scanning signals) and data lines $D_1$-$D_m$ transmitting data signals. The gate lines $G_1$-$G_{2n}$ extend substantially in a row direction and are substantially parallel to each other, while the data lines $D_1$-$D_m$ extend substantially in a column direction and are substantially parallel to each other.

Each pixel PX includes a switching element Q connected to one of the gate lines $G_1$-$G_{2n}$ and one of the data lines $D_1$-$D_m$, and pixel circuits connected to the switching element Q. The switching element Q is provided on the lower panel 100 and has three terminals: a control terminal connected to one of the gate lines $G_1$-$G_{2n}$; an input terminal connected to one of the data lines $D_1$-$D_m$; and an output terminal connected to the pixel circuit.

In active matrix type LCDs, which are an example of a flat panel display device, the panel assembly 300 includes the lower panel 100, the upper panel 200, a liquid crystal (LC) layer 3 disposed between the lower and upper panels 100 and 200, and the display signal lines $G_1$-$G_{2n}$ and $D_1$-$D_m$ and the switching elements Q are provided on the lower panel 100. Each pixel circuit includes an LC capacitor $C_{LC}$ and a storage capacitor $C_{ST}$ that are connected in parallel with the switching element Q. The storage capacitor $C_{ST}$ may be omitted if the storage capacitor $C_{ST}$ is not needed.

The LC capacitor $C_{LC}$ includes a pixel electrode 190 on the lower panel 100, a common electrode 270 on the upper panel 200, and the LC layer 3 as a dielectric between the pixel and common electrodes 190 and 270. The pixel electrode 190 is connected to the switching element Q, and the common electrode 270 covers the entire surface of the upper panel 200 and is supplied with a common voltage Vcom. Alternatively, both the pixel electrode 190 and the common electrode 270, which have shapes of bars or stripes, are provided on the lower panel 100.

The storage capacitor $C_{ST}$ is an auxiliary capacitor for the LC capacitor $C_{LC}$. The storage capacitor $C_{ST}$ includes the pixel electrode 190 and a separate signal line (not shown), which is provided on the lower panel 100 and overlaps the pixel electrode 190 with an insulator disposed between the pixel electrode 190 and the separate signal line. The storage capacitor $C_{ST}$ is supplied with a predetermined voltage such as the common voltage Vcom. Alternatively, the storage capacitor $C_{ST}$ includes the pixel electrode 190 and an adjacent gate line called a previous gate line, which overlaps the pixel electrode 190 with an insulator disposed between the pixel electrode 190 and the previous gate line.

For a color display, each pixel uniquely represents one of three primary colors such as red, green and blue colors (spatial division) or sequentially represents the three primary colors in time (temporal division), thereby obtaining a desired color. FIG. 2 shows an example of the spatial division in which each pixel includes a color filter 230 representing one of the three primary colors in an area of the upper panel 200 facing the pixel electrode 190. Alternatively, the color filter 230 is provided on or under the pixel electrode 190 on the lower panel 100.

As shown in FIG. 3, the panel assembly 300 includes a peripheral area 32 defining a display area 31 in which the pixels PX and a majority portion of the display signal lines $G_1$-$G_{2n}$ and $D_1$-$D_m$ are provided. The upper panel 200 may be smaller than the lower panel 100, such that the lower panel 100 has an exposed area into which the data lines $D_1$-$D_m$ are extended to connect to a data driver 500. The gate lines $G_1$-$G_{2n}$ are extended into the peripheral area 32 to be connected to gate drivers 400L and 400R. A pair of polarizers (not shown) for polarizing light are attached on outer surfaces of the lower and upper panels 100 and 200 of the panel assembly 300.

Referring back to FIG. 1, a gray voltage generator 800 generates two sets of gray voltages related to a transmittance of the pixels PX. The gray voltages in one set have a positive polarity with respect to the common voltage Vcom, while the gray voltages in the other set have a negative polarity with respect to the common voltage Vcom.

The gate drivers 400L and 400R are arranged at opposite sides of the panel assembly 300 and connected to odd gate lines $G_1$, $G_3$, ..., $G_{2n-1}$ and even gate lines $G_2$, $G_4$, ..., $G_{2n}$, respectively. The gate drivers 400L and 400R synthesize the gate-on voltage Von and the gate-off voltage Voff to generate gate signals for application to the gate lines $G_1$-$G_{2n}$. The gate drivers 400L and 400R are shift registers, which include a plurality of stages in a line. The gate drivers 400L and 400R are provided in the peripheral area 32 of FIG. 3, and are formed together with switching elements Q of the pixels PX to be integrated. However, the gate drivers 400L and 400R may be mounted in an integrated circuit.

The data driver 500 is connected to the data lines $D_1$-$D_m$ of the panel assembly 300 and applies data voltages selected from the gray voltages supplied from the gray voltage generator 800 to the data lines $D_1$-$D_m$. The signal controller 600 controls the gate drivers 400L and 400R and the data driver 500. The signal controller 600, the data driver 500 and the gray voltage generator 800 are implemented by one chip 33 to be mounted as a COG (chip on glass) type chip. Alternatively, the signal controller 600, the data driver 500 and the gray voltage generator 800 may be mounted in a COF (chip on film) as separate chips.

Now, the operation of the display device will be described in detail referring to FIG. 1.

The signal controller 600 is supplied with image signals R, G and B and input control signals controlling the display of the image signals R, G and B. The input control signals include, for example, a vertical synchronization signal Vsync, a horizontal synchronization signal Hsync, a main clock MCLK, and a data enable signal DE, from an external graphic controller (not shown). After generating gate control signals CONT1 and data control signals CONT2 and processing the image signals R, G and B suitable for the operation of the panel assembly 300 in response to the input control signals, the signal controller 600 provides the gate control signals CONT1 to the gate drivers 400L and 400R, and the processed image signals R', G' and B' and the data control signals CONT2 to the data driver 500.

The gate control signals CONT1 include a vertical synchronization start signal STV for informing the gate drivers 400L and 400R of a start of a frame, a gate clock signal CPV for controlling an output time of the gate-on voltage Von, and an output enable signal OE for defining a width of the gate-on voltage Von.

The data control signals CONT2 include a horizontal synchronization start signal STH for informing the data driver 500 of a start of a horizontal period, a load signal LOAD or TP for instructing the data driver 500 to apply the appropriate data voltages to the data lines $D_1$-$D_m$ an inversion control signal RVS for reversing the polarity of the data voltages (with respect to the common voltage Vcom) and a data clock signal HCLK.

The data driver 500 receives the processed image signals R', G' and B' for a pixel row from the signal controller 600 and converts the processed image signals R', G' and B' into the analogue data voltages selected from the gray voltages supplied from the gray voltage generator 800 in response to the data control signals CONT2 from the signal controller 600.

Responsive to the gate control signals CONT1 from the signal controller 600, the gate drivers 400L and 400R apply the gate-on voltage Von to the gate lines $G_1$-$G_{2n}$, thereby turning on the switching elements Q connected to the gate lines $G_1$-$G_{2n}$.

The data driver 500 applies the data voltages to corresponding data lines $D_1$-$D_m$ for a turn-on time of the switching elements Q (which is called "one horizontal period" or "1 H" and equals one period of the horizontal synchronization signal Hsync, the data enable signal DE, and the gate clock signal CPV). The data voltages in turn are supplied to corresponding pixels via the turned-on switching elements Q.

The difference between the data voltage and the common voltage Vcom applied to a pixel is expressed as a charged voltage of the LC capacitor $C_{LC}$, i.e., a pixel voltage. The liquid crystal molecules have orientations depending on a magnitude of the pixel voltage and the orientations determine a polarization of light passing through the LC capacitor $C_{LC}$. The polarizers convert light polarization into light transmittance.

By repeating the above described procedure, all gate lines $G_1$-$G_{2n}$ are sequentially supplied with the gate-on voltage Von during a frame, thereby applying the data voltages to all pixels. In case of the LCD shown in FIG. 1, when a next frame starts after finishing one frame, the inversion control signal RVS applied to the data driver 500 is controlled such that a polarity of the data voltages is reversed (which is called "frame inversion"). The inversion control signal RVS may be controlled such that the polarity of the data voltages flowing in a data line in one frame are reversed (which is called "column inversion"), or the polarity of the data voltages in one packet are reversed (which is called "dot inversion").

Structures and operations of gate drivers according to exemplary embodiments of the present invention will be described in detail with reference to FIGS. 4 to 10.

Figure 4:
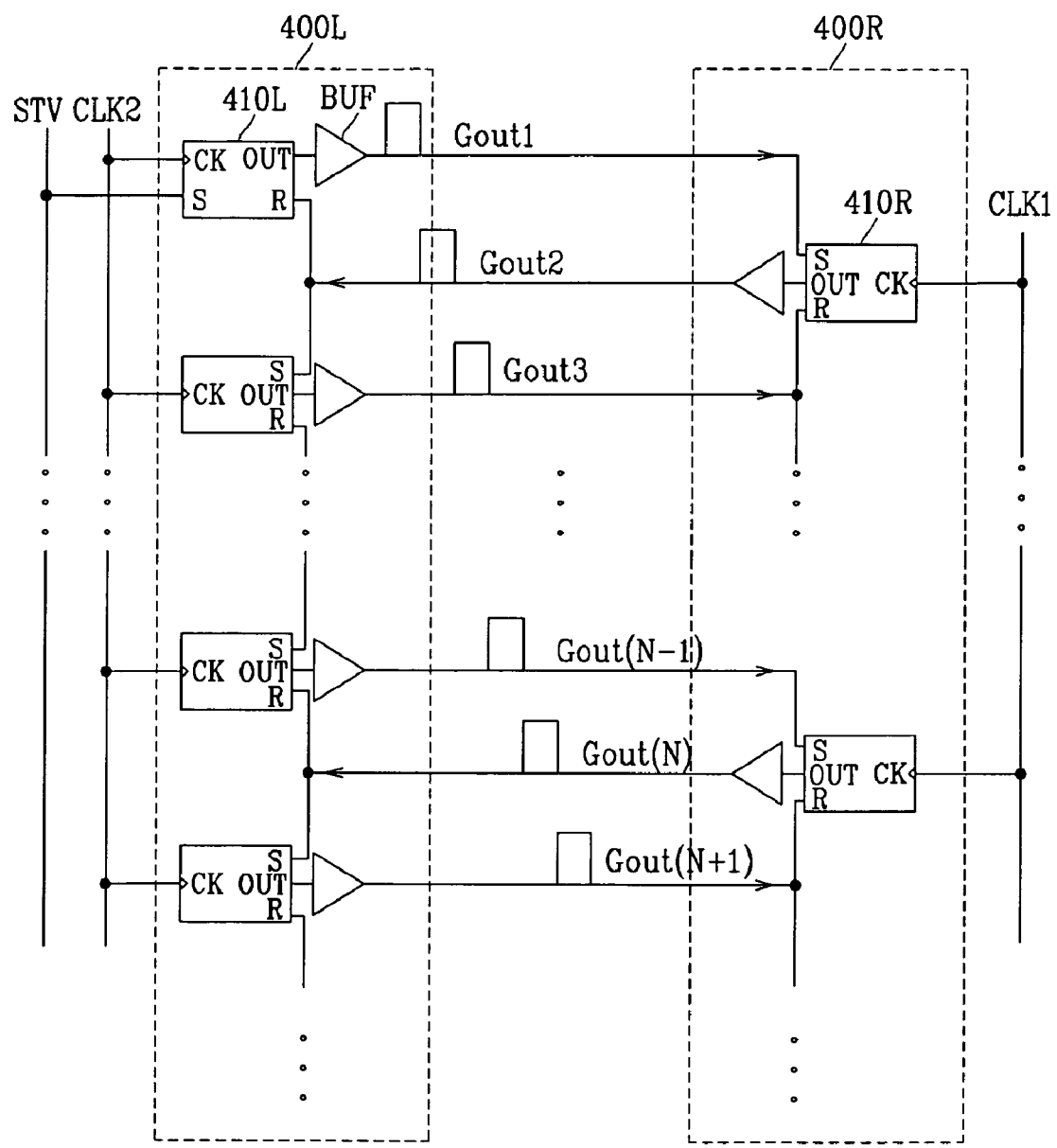
FIG. 4 is a block diagram of a gate driver according to an exemplary embodiment of the present invention.
Figure 5:
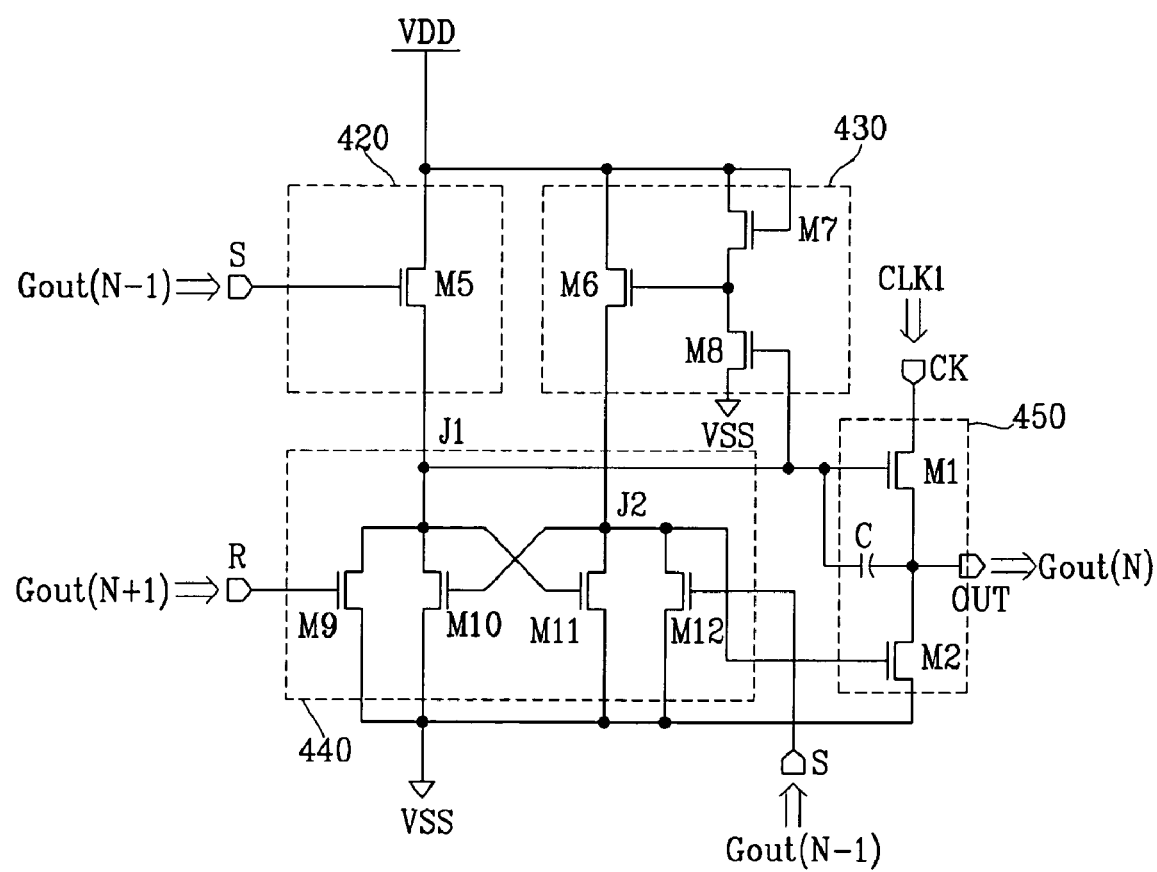
FIG. 5 is an exemplary circuit diagram of an N-th stage of a shift register for the gate driver shown in FIG. 4.
Figure 6A:
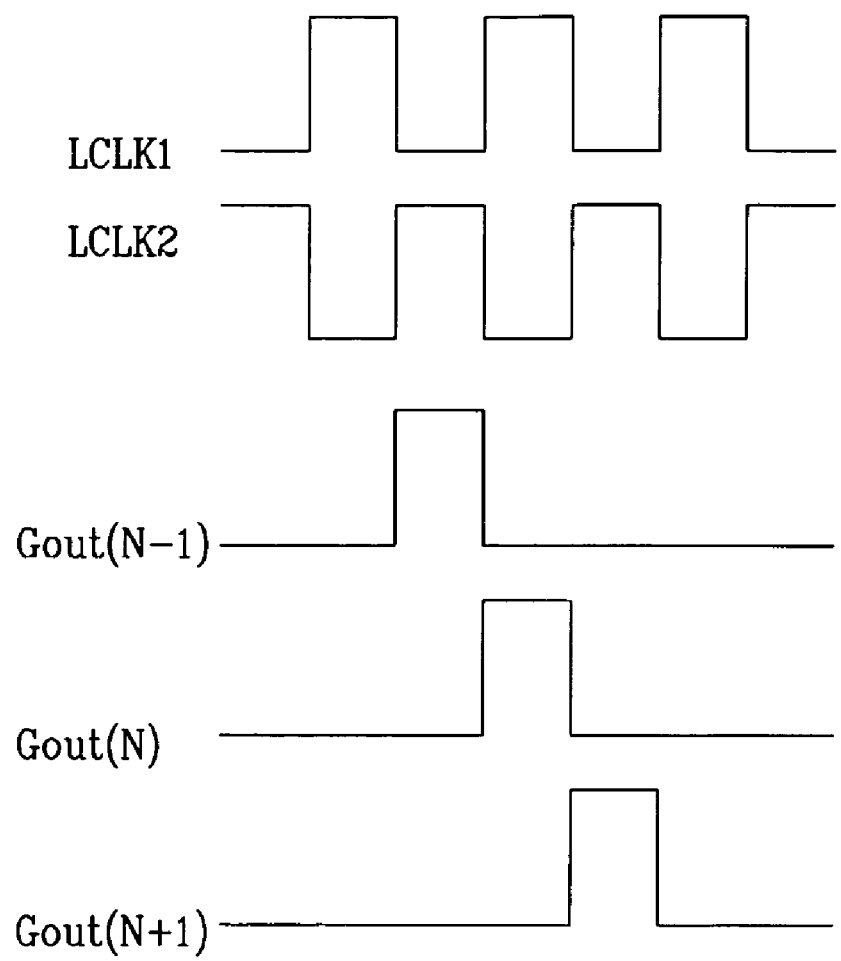
FIGS. 6A and 6B are waveforms of signals of the gate driver shown in FIG. 4.
Figure 6B:
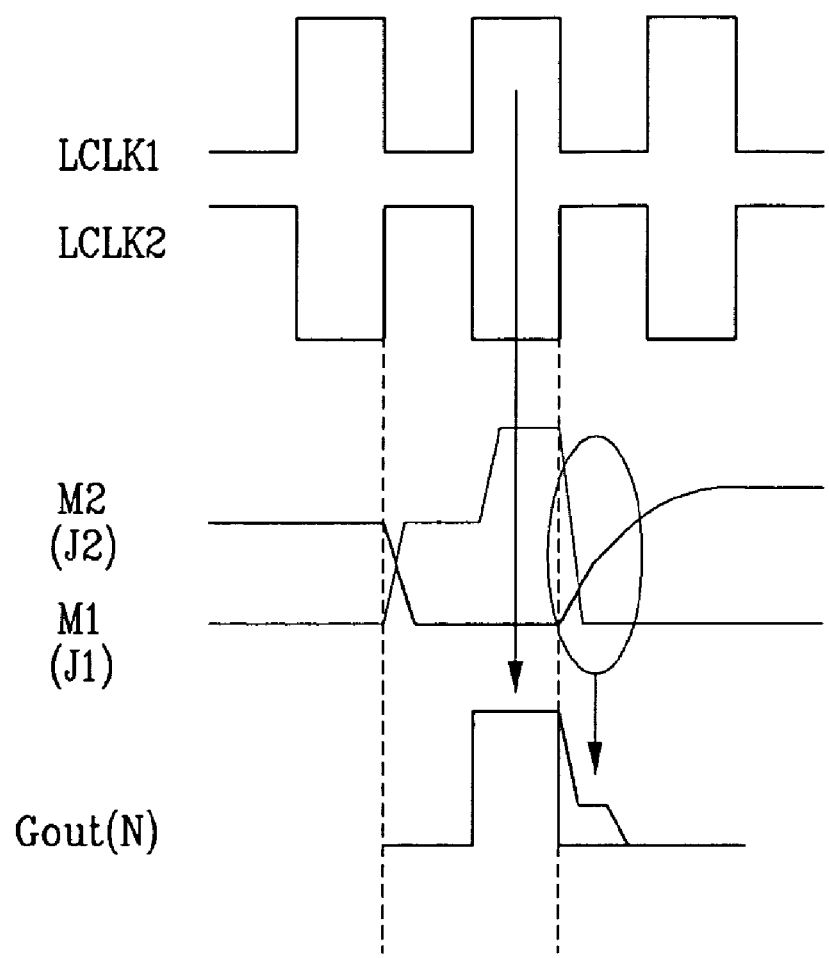

FIG. 4 is a block diagram of gate drivers according to an exemplary embodiment of the present invention, and FIG. 5 is an exemplary circuit diagram of an N-th stage of a shift register for the gate drivers shown in FIG. 4, and FIGS. 6A and 6B are waveforms of signals of the gate driver shown in FIG. 4.

The gate drivers 400L and 400R include a left shift register 400L and a right shift register 400R. A first clock signal CLK1 is inputted to the right shift register 400R and the vertical synchronization start signal STV and a second clock signal CLK2 are inputted to the left shift register 400L as shown in FIG. 4. As shown in FIGS. 6A and 6B, the duty ratio and the phase difference of the first and second clock signals CLK1 and CLK2 is 50% and 180 degrees, respectively.

Each one of the left and right shift registers 400L and 400R includes a plurality of stages referred to as left shift register stages 410L and right shift register stages 410R, respectively. Left and right shift register stages 410L and 410R are arranged in a column and connected to odd and even gate lines $G_1$-$G_{2n}$, respectively. Each left shift register stage 410L and each right shift register stage 410R includes a set terminal S, a clock terminal CK, a reset terminal R and an output terminal OUT which is connected to a buffer BUF. Each of the left and right shift register stages 410L and 410R is arranged such that, for example, the set terminal S of an N-th right shift register stage 410R receives an output of a previous corresponding left shift register stage 410L, i.e., a previous gate output Gout(N−1). Additionally, the reset terminal R of the N-th right shift register stage 410R receives an output of a next corresponding left shift register stage 410L, i.e., a next gate output Gout(N+1) and the clock terminal CK thereof receives the clock signal CLK1. Each right shift register stage 410R outputs a gate output Gout(N) via the output terminal OUT and the buffer BUF, which are applied to corresponding ones of the gate lines $G_1$-$G_{2n}$. In other words, each shift register stage generates a gate output synchronized with the clock signals CLK1 and CLK2 based on previous stage and next stage gate outputs. Thus, a previous and a next stage of a particular shift register, for example, the left shift register 400L, are located in an opposite shift register, for example, the right shift register 400R.

However, the S terminal of an initial stage of the left shift register 400L is supplied with the vertical synchronization start signal STV instead of the previous gate output, and a high interval of the vertical synchronization start signal STV is located in a low interval of the clock signal CLK2.

Two adjacent left and right shift register stages 410L and 410R of each of the left and right shift registers 400L and 400R are supplied with the same clock signals CLK2 and CLK1, respectively. For example, the two adjacent left shift register stages 410L are each supplied with the clock signal CLK2, and the two adjacent right shift register stages 410R are each supplied with the clock signal CLK1. Each clock signal CLK1 and CLK2 is preferably the gate-on voltage Von for a high interval and is the gate-off voltage for a low interval in order to drive the switching elements Q of the pixels.

Each of the left and right shift register stages 410L and 410R, for example, N-th stage of the left and right shift registers 400L and 400R according to an exemplary embodiment of the present invention, as shown in FIG. 5, includes an input unit 420, a pull-up driving unit 430, a pull-down driving unit 440 and an output unit 450. Each of the above-described units 420, 430, 440 and 450 includes at least a NMOS transistor, for example, M1, M2, or M5-M12, which acts as an electrical conduction path between a drain and a source of each transistor controlled by an input at a gate of each transistor. The output unit 450 further includes a capacitor C. It should be noted that the NMOS transistors may be replaced by PMOS transistors. In addition, the capacitor C may be a parasitic capacitance between a gate and either a drain or a source formed during a manufacturing process, and a high voltage VDD and a low voltage VSS may be the gate-on voltage Von and the gate-off voltage Voff, respectively.

The input unit 420 includes transistor M5 having a gate connected to a set terminal S, and the transistor M5 outputs the high voltage VDD connected to a drain of the transistor M5 to a contact J1 via a source of the transistor M5 when the gate is applied with the previous gate output Gout(N−1).

The pull-up driving unit 430 includes a transistor M6, which has a drain thereof applied with the high voltage VDD for output to a contact J2, and transistors M7 and M8 connected in series between the high and the low voltages VDD and VSS. The transistor M7 functions as a kind of a diode by connection of a gate and a drain thereof, and a gate of the transistor M8 is connected to the contact J1 and a gate of the transistor M6 is a point of contact between a source and a drain of the transistors M7 and M8, respectively.

The pull-down driving unit 440 includes transistors M9-M12. A gate and a drain of the transistor M9 are connected to reset terminal R and the contact J1, respectively, and a gate and a drain of the transistor M12 are connected to the set terminal S and the contact J2, respectively. A gate and a drain of the transistor M10 are connected to the contacts J2 and J1, respectively, and a gate and a drain of the transistor M11 are connected to the contacts J1 and J2, respectively.

The output unit 450 includes transistors M1 and M2 and the capacitor C. The transistors M1 and M2 are connected in series between the clock terminal CK and the low voltage VSS to selectively output either the clock signal CLK1 or the low voltage VSS depending on voltages at the contacts J1 and J2. A gate of the transistor M1 is connected to the contact J1 and is connected to the output terminal OUT via the capacitor C. A gate of the transistor M2 is connected to the contact J2 and a drain of the transistor M2 is connected to the output terminal OUT. A source of the transistor M1 is connected to the drain of the transistor M2 at the output terminal OUT.

Now, an operation of a stage will be described in detail with reference to FIGS. 6A and 6B.

When the above-exemplified N-th stage generates the gate output synchronized with the clock signal CLK1, the previous and the next stage thereof generate the gate output synchronized with the clock signal CLK2. Variations of the gate voltages (of three terminals) of the transistors M1 and M2 are further shown in FIG. 6B.

At first, when the previous gate output signal Gout(N−1) and the next gate output signal Gout(N+1) are low, the transistors M5 and M12 and the transistor M9 connected to the set terminal S and the reset terminal R, respectively, are turned off. In addition, when the transistor M8 is turned off due to low voltage at the contact J1, and the transistor M7 outputs the high voltage VDD to the gate of the transistor M6, the transistor M6 is turned on to transmit the high voltage VDD to the contact J2. Then, the high voltage VDD at the contact J2 is applied to a gate of the transistor M10, which is turned on to pull down a voltage of the contact J1 to the low voltage VSS, and accordingly, the transistor M11 is turned off to disconnect the contact J2 from the low voltage VSS. As a result, since the voltage of the contact J1 becomes the low voltage VSS and a voltage of the contact J2 becomes the high voltage VDD, a gate voltage of transistor M1 connected to the contact J1 becomes low to turn off the transistor M1 and disconnect the output terminal OUT from the clock signal CLK1. Since a gate voltage of the transistor M2 connected to the contact J2 is high, the low voltage VSS is transmitted to the output terminal OUT. Therefore, at this time, the output Gout(N) is low.

Successively, when the previous gate output signal Gout(N−1) becomes high, the transistors M5 and M12 are turned on to transmit the high voltage VDD to the contact J1 and the low voltage VSS to the contact J2. Accordingly, the transistor M10 is turned off to disconnect the contact J1 from the low voltage VSS, thereby turning on transistor M11 to pull down the voltage of the contact J2. Additionally, since the transistor M8 is turned on to output the low voltage VSS to the gate of the transistor M6, the transistor M6 is turned off to disconnect the contact J2 from the high voltage VDD.

Accordingly, while the capacitor C having one terminal connected to the contact J1 begins to charge, the gate voltage of transistor M1 rises as shown in FIG. 6B and the transistor M1 is turned on to transmit the clock signal CLK1 to the output terminal OUT. On the other hand, since transistor M2 is turned off, the low voltage VSS is disconnected from the output terminal OUT, the gate output Gout(N) is same as the clock signal CLK1, which is low.

When the previous gate output Gout(N−1) becomes low again, the transistors M5 and M12 are turned off and the input of the reset terminal R still remains low, therefore the transistor M9 is turned off and the contact J1 in a floating state. Charge of a voltage of the capacitor C maintains the voltage of the contact J1 in a previous state and according thereto the remaining transistors M1, M2, M6, M8, M10 and M12 remain in previous states. At the same time, as the clock signal CLK1 becomes high thereby changing the output Gout(N) to a high voltage, the voltage of the contact J1, which is connected to the capacitor C and applied to the gate of the transistor M1, rises as much as the output voltage Gout(N).

Subsequently, when the previous gate output Gout(N+1) becomes high, the transistor M9 is turned on to transmit the low voltage VSS to the contact J1. Then, since the transistor M8 is turned off and thereby the transistor M6 is turned on, the contact J2 is changed back into the high voltage VDD. Therefore, since the gate of the transistor M10 is connected to the contact J2, the transistor M10 is turned on to pull down the contact J1 to the low voltage VSS and to turn off the transistor M11 thereby disconnecting the contact J2 from the low voltage VSS. As a result, since the contact J1 becomes the low voltage VSS, the capacitor C discharges, thereby decreasing the gate voltage of the transistor M1 such that the transistor M1 is turned off, the output terminal OUT is disconnected from the clock signal CLK1. Since the contact J2 becomes the high voltage VDD to turn on the transistor M2, the low voltage VSS is provided to the output terminal OUT and the output voltage Gout(N) becomes low.

However, as shown by a circle in FIG. 6B, a falling speed of the contact J1 is high since the voltage developed at the gate of the transistor M1, i.e., the voltage of the contact J1, is promptly connected to the low voltage VSS immediately after the transistor M9 is turned on. Additionally, the rising speed of the contact J2 is low since the contact J2 is not connected to the high voltage VDD until the transistor M6 is turned on after the voltage at the contact J1 falls and the transistor M8 is turned off. Therefore, there exists an intermediate time period during which the voltage of the contact J1 falls to a level able to turn off the transistor M1, but the voltage of the contact J2 has not yet risen to a level able to turn on the transistor M2. During the intermediate time period, since both of the transistors M1 and M2 are turned off to float the output terminal OUT, the output voltage Gout(N) remains constant. Thereafter, when the voltage of the contact J2 has risen to the level able to turn on the transistor M2, the output voltage Gout(N) falls to a low state normally.

Referring now to FIGS. 7-10, a gate driver according to another embodiment of the present invention will be described.

Figure 7:
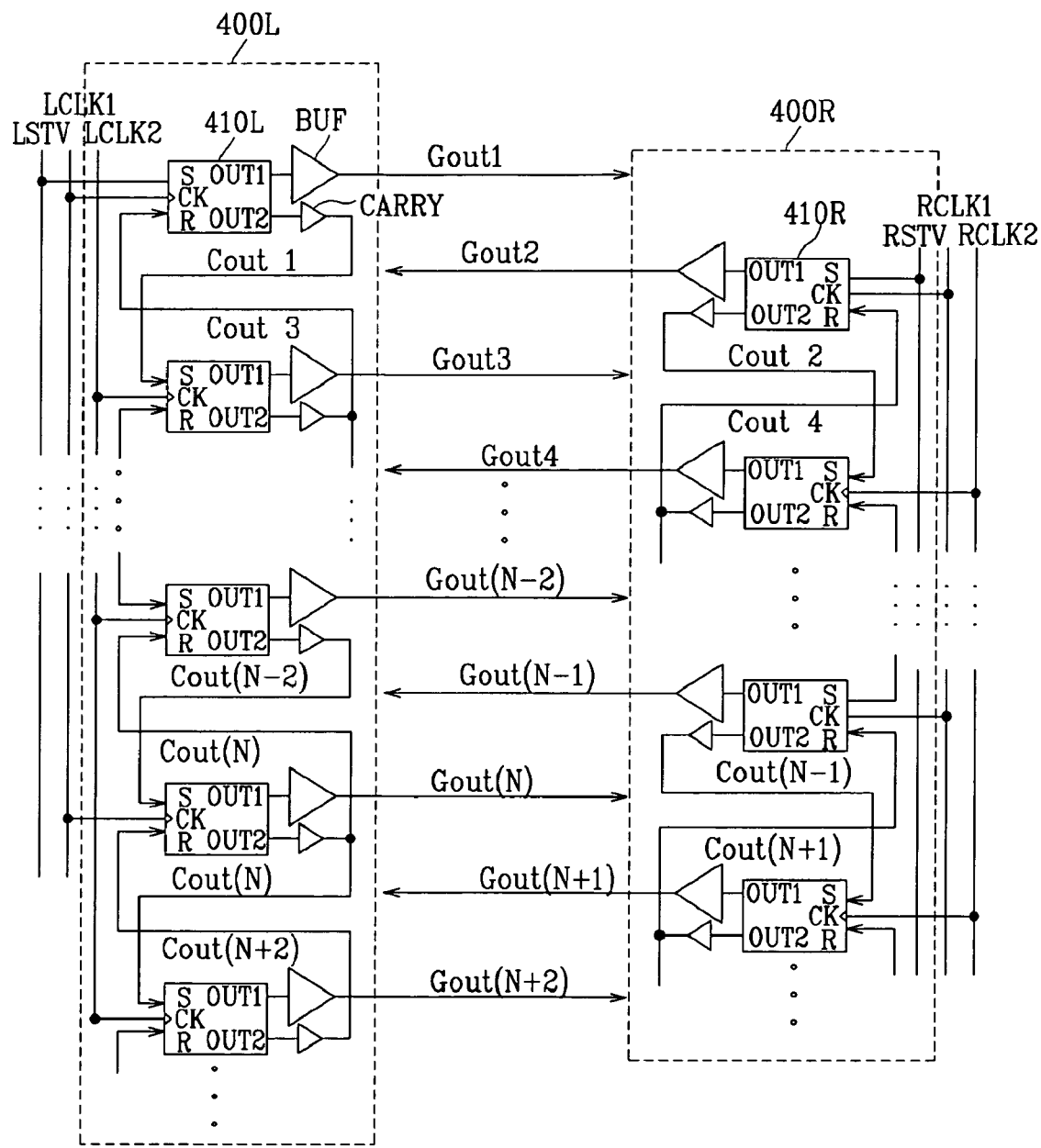
FIG. 7 is a block diagram of a gate driver according to another exemplary embodiment of the present invention.
Figure 8:
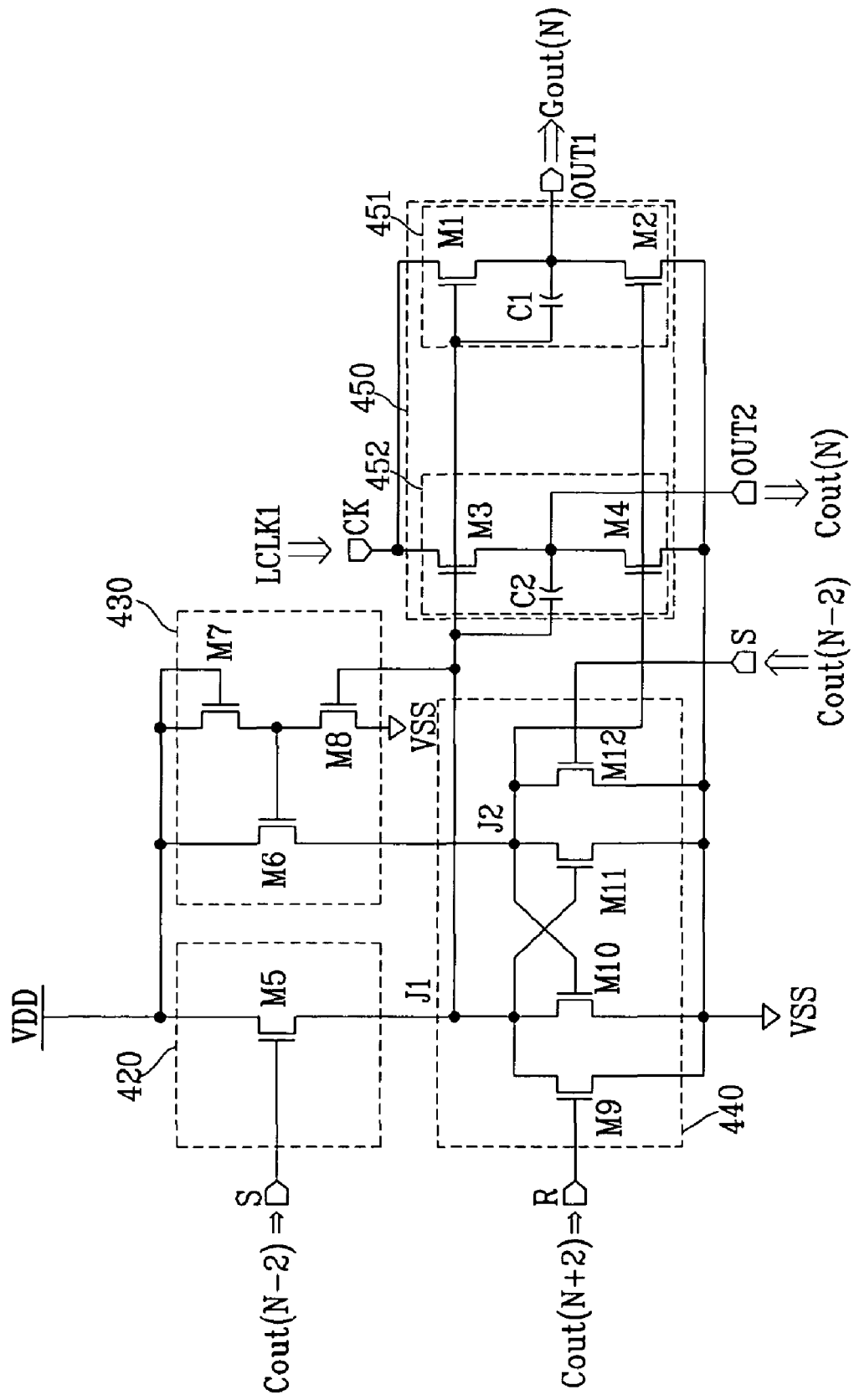
FIG. 8 is an exemplary circuit diagram of an N-th stage of a shift register for the gate driver shown in FIG. 7.

FIG. 7 is a block diagram of a gate driver according to another exemplary embodiment of the present invention, and FIG. 8 is an exemplary circuit diagram of an N-th stage of a shift register for the gate driver of FIG. 7, and FIGS. 9A, 9B and 10 are waveforms of the gate driver shown in FIG. 7.

The left and right shift registers 400L and 400R shown in FIG. 7 are supplied with a first synchronization start signal LSTV, a second vertical synchronization start signal RSTV, and a first to a fourth clock signal LCLK1, RCLK1, LCLK2 and RCLK2. Each of the left and right shift registers 400L and 400R includes left and right shift register stages 410L and 410R, respectively, arranged in a column and connected to the gate lines.

Figure 10:
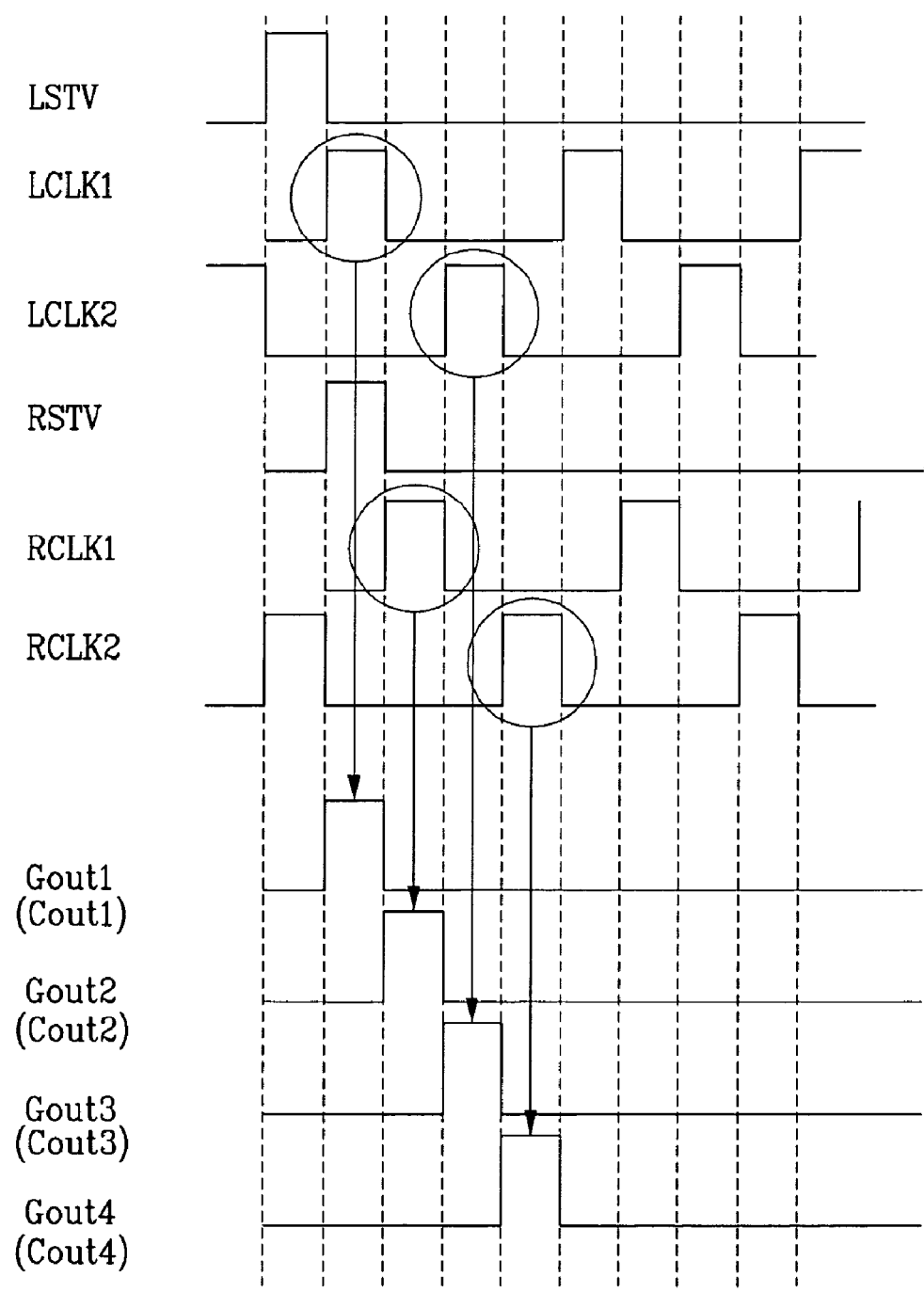

As shown in FIG. 10, the first vertical synchronization start signal LSTV inputted to the left shift register 400L and the second vertical synchronization start signal RSTV inputted to the right shift register 400R are signals of one frame period including one pulse with a width of 1 H each frame, and the second vertical synchronization start signal RSTV is delayed by 1 H relative to the first vertical synchronization start signal LSTV. The first to the fourth clock signals LCLK1, RCLK1, LCLK2 and RCLK2 have a duty ratio of 25% and periods of 4 H, and phase differences of 90 degrees, sequentially.

Each of the left and right shift register stages 410L and 410R includes a set terminal S, a clock terminal CK, a reset terminal R, a gate output terminal OUT 1 and a carry output terminal OUT2, and the gate and carry output terminals OUT1 and OUT2 are connected to a gate buffer BUF and a carry buffer CARRY, respectively.

Each of the left and right shift register stages 410L and 410R and the gate and carry buffers BUF and CARRY are formed together with the switching elements Q of the pixels to be integrated on the same panel assembly 300.

Each left shift register stage 410L, for example, a set terminal S of the N-th left shift register stage 410L, receives a carry output of a previous stage, i.e., a previous carry output Cout(N−2), and a reset terminal R of the N-th left shift register stage 410L, receives the carry output of a next stage, i.e., a next carry output Cout(N+2), and the clock terminal CK receives the first clock signal LCLK1. The gate and carry output terminals OUT1 and OUT2 output the gate output Gout(N) and the carry output Cout(N) via the gate buffer BUF and the carry buffer CARRY, respectively. The gate output Gout(N) is supplied to the gate lines $G_1$-$G_{2n}$ and the carry output Cout(N) is supplied to previous and next stages.

In summary, each of the left and right shift register stages 410L and 410R generates the gate output Gout(N) and the carry output Cout(N) synchronized with the first to fourth clock signals LCLK1, RCLK1, LCLK2 and RCLK2 based on the previous and the next carry outputs Cout(N−2) and Cout(N+2). The previous and the next stages are located in a same shift register unlike those in FIG. 4.

In this case, an initial stage of each of the left and right shift register stages 410L and 410R is supplied with the first and the second vertical synchronization start signal LSTV and RSTV, respectively, instead of a previous carry output. A high interval of the first vertical synchronization start signal LSTV inputted to the initial left shift register stage 410L occurs during a low interval of the first clock signal LCLK1 and the first vertical synchronization start signal LSTV becomes low a first time the first clock signal LCLK1 becomes high. A high interval of the second vertical synchronization start signal RSTV inputted to the initial right shift register stage 410R occurs during a low interval of the second clock signal RCLK1, and the second vertical synchronization start signal RSTV becomes low at the same time when the second clock signal RCLK1 becomes high.

Adjacent stages of the left and right shift register stages 410L and 410R in each of the left and right shift registers 400L and 400R, respectively, are supplied with different ones of the first to fourth clock signals LCLK1, RCLK1, LCLK2 and RCLK2. For instance, the initial left shift register stage 410L is supplied with the first clock signal LCLK1 and a next left shift register stage 410L is supplied with the third clock signal LCLK2, and the initial right shift register stage 410R is supplied with the second clock signal RCLK1 and a next right shift register stage 410R is supplied with the fourth clock signal RCLK2.

Each of the first to fourth clock signals LCLK1, RCLK1, LCLK2 and RCLK2 is preferably the gate-on voltage Von for a high interval and is the gate-off voltage for a low interval in order to drive the switching elements Q of the pixels.

Each of the left and right shift register stages 410L and 410R, for example, the N-th stage, is substantially the same as that shown in FIG. 5. For example, as shown in FIG. 8, the N-th stage includes an input unit 420, a pull-up driving unit 430, a pull-down driving unit 440, a gate output unit 451 and a carry output unit 452. Each of the above mentioned units 420, 430, 440, 451 and 452 comprises at least a NMOS transistor, for example, transistors M1-M12, and may comprise one of capacitors C1 and C2.

The input unit 420 includes the transistor M5 connected to a set terminal S. The pull-up driving unit 430 includes the transistors M6, M7 and M8. The transistor M6 receives a high voltage VDD via a drain of the transistor M6 and transmits the high voltage VDD to a contact J2 via a source of the transistor M6 in response to a sufficient voltage at a gate of the transistor M6. The transistors M7 and M8 are connected in series between the high and the low voltages VDD and VSS. The pull-down driving unit 440 includes the transistors M9-M12 receiving a low voltage VSS via a source of each of the transistors M9-M12 and transmitting the low voltage VSS to one of the contacts J1 and J2 via a drain of each of the transistors M9-M12 in response to a sufficient voltage at a gate of each of the transistors M9-M12.

However, unlike the stage shown in FIG. 5, the output unit 450 includes the gate output unit 451 and the carry output unit 452 connected in parallel between the clock terminal CK and the low voltage VSS, and connected to the gate output terminal OUT1 and the carry output terminal OUT2, respectively.

The gate output unit 451 includes the transistors M1 and M2 and capacitor C1 connected between the clock terminal CK and the low voltage VSS to selectively transmit either the first clock signal LCLK1 or the low voltage VSS to the gate output terminal OUT1 depending on voltages of the contacts J1 and J2. A drain of the transistor M1 is connected to the first clock signal LCLK1 and a source of the transistor M1 is connected to a drain of the transistor M2 and the gate output terminal OUT1. A source of the transistor M2 is connected to the low voltage VSS. A gate of the transistor M1 is connected to the contact J1, and a gate of the transistor M2 is connected to the contact J2. The capacitor C1 is connected between the contact J1 and the gate output terminal OUT1.

The carry output unit 452 includes the transistors M3 and M4 and the capacitor C2 connected between the clock terminal CK and the low voltage VSS to selectively transmit either the first clock signal LCLK1 or the low voltage VSS to the carry output terminal OUT2 depending on the voltages of the contacts J1 and J2. A drain of the transistor M3 is connected to the first clock signal LCLK1 and a source of the transistor M3 is connected to a drain of the transistor M4 and the carry output terminal OUT2. A source of the transistor M4 is connected to the low voltage VSS. A gate of the transistor M3 is connected to the contact J1, and a gate of the transistor M4 is connected to the contact J2. The capacitor C2 is connected between the contact J1 and the carry output terminal OUT2.

Figure 9A:
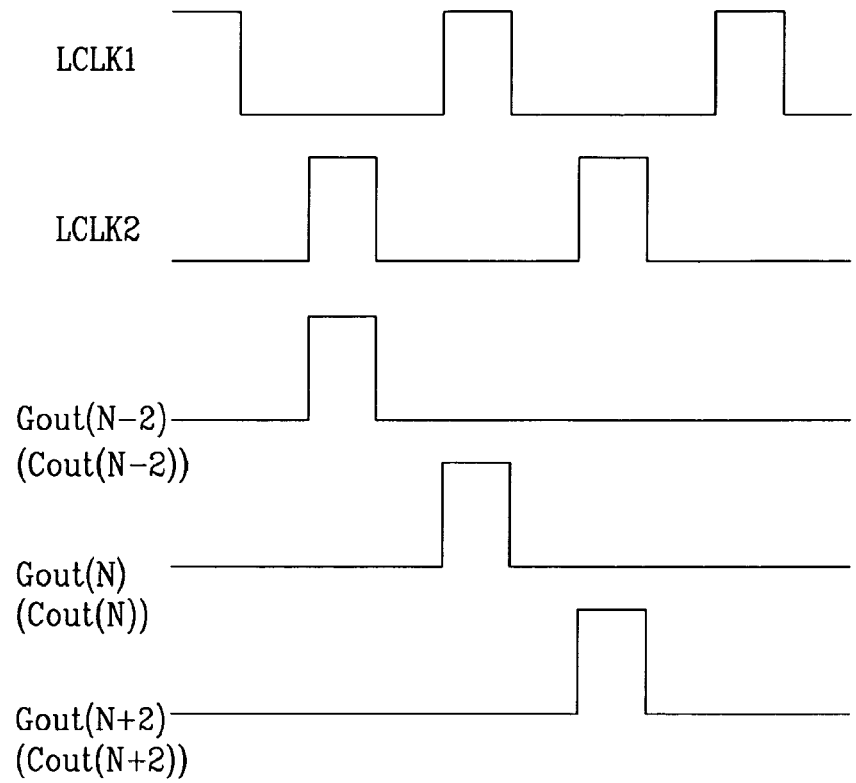
FIGS. 9A, 9B and 10 are waveforms of the gate driver shown in FIG. 7.

Now, an operation of the shift register shown in FIG. 8 will be described with reference to FIGS. 9A and 9B.

When the N-th stage generates a carry output synchronized with the first clock signal LCLK1, previous and next stages generate the carry output synchronized with the third clock signal LCLK2.

When both of the previous and the next carry outputs Cout(N−2) and Cout(N+2) are low and then both of the inputs of the set terminal S and the reset terminal R are low and the voltage of the contact J1 is low, as described in FIG. 5, the outputs Gout(N) and Cout(N) are low. When the previous carry output Cout(N−2) becomes high and then the input of the set terminal S becomes high, as described in FIG. 5, the voltage of the contact J1 becomes high and that of the contact J2 becomes low, and thereby the transistors M1 and M3 are turned on and the transistors M2 and M4 are turned off. Accordingly, the outputs Gout(N) and Cout(N) are low.

When the previous carry output Cout(N−2) becomes low such that an input of the set terminal S becomes low again, as described in FIG. 5, the contact J1 remains floating and the voltage at the contact J1 is the high voltage VDD but the first clock signal LCLK1 is low still, and thereby the outputs Gout(N) and Cout(N) remain low.

Subsequently, when the first clock signal LCLK1 becomes high, the outputs Gout(N) and Cout(N) become high, and the contact J1 remains floating. Accordingly, the voltage of the contact J1 increases by a voltage level of the outputs Gout(N) and Cout(N).

Next, when the first clock signal LCLK1 becomes low again, the contact J1 remains in the floating state and thus drops to the high voltage VDD. Accordingly, the transistors M1 and M3 remain turned on, but the first clock signal LCLK1 is low and thereby the outputs Gout(N) and Cout(N) become low as well.

Subsequently, when the next carry output Cout(N+2) becomes high, the transistors M1 and M3 are turned off to disconnect the gate and carry output terminals OUT1 and OUT2 from the first clock signal LCLK1, and the transistors M2 and M4 are turned on to transmit the low voltage VSS to the gate and carry output terminals OUT1 and OUT2. Although the transistors M1 and M2 or the transistors M3 and M4 are turned off such that the gate and carry output terminals OUT1 and OUT2 lie in the floating state, as shown in FIG. 9B, the outputs Gout(N) and Cout(N) are already low and thereby the outputs Gout(N) and Cout(N) remain constant throughout the floating state.

FIGS. 11A and 11B, FIGS. 12A and 12B and FIGS. 13A and 13B are waveforms to represent gate outputs in a normal state of the shift registers shown in FIGS. 4 and 7, respectively.

Hereinafter, gate outputs represent a first gate output Gout1, a second gate output Gout2, and a third gate output Gout3.

Figure 11A:
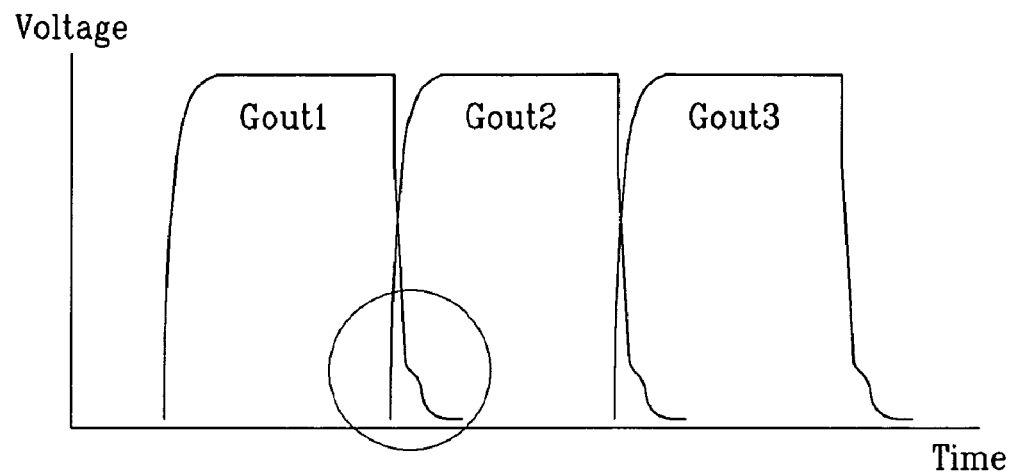
FIGS. 11A and 11B are waveforms to represent gate outputs during a normal state of the gate drivers shown in FIGS. 4 and 7, respectively.
Figure 11B:
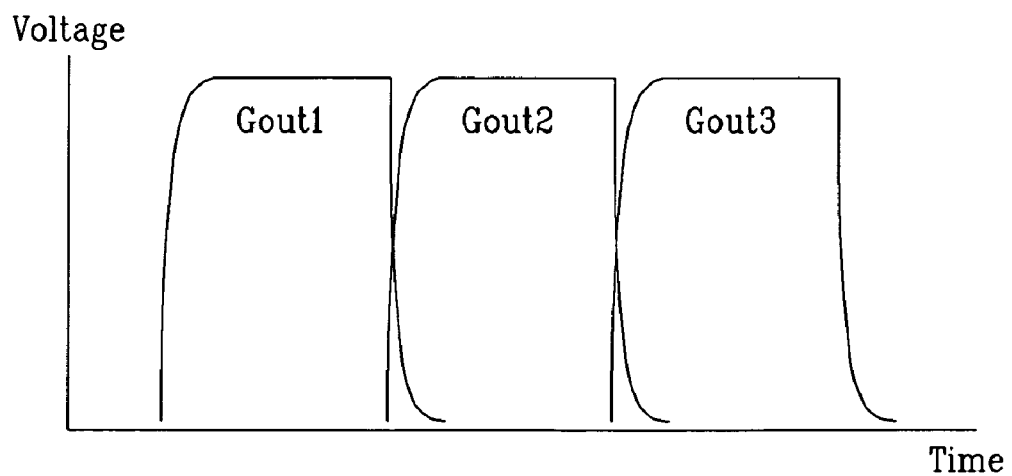
Figure 12A:
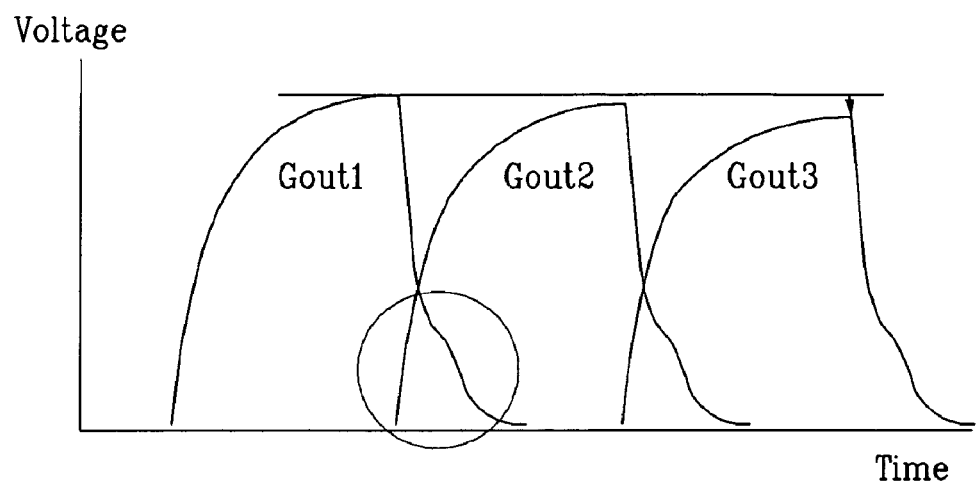
FIGS. 12A and 12B are waveforms to represent gate outputs during a low temperature driving condition of the gate drivers shown in FIGS. 4 and 7, respectively.
Figure 12B:
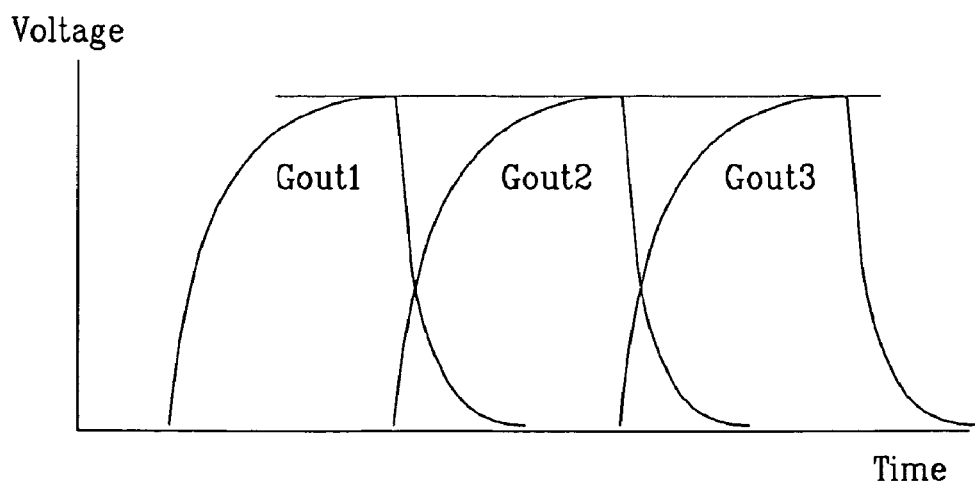
Figure 13A:
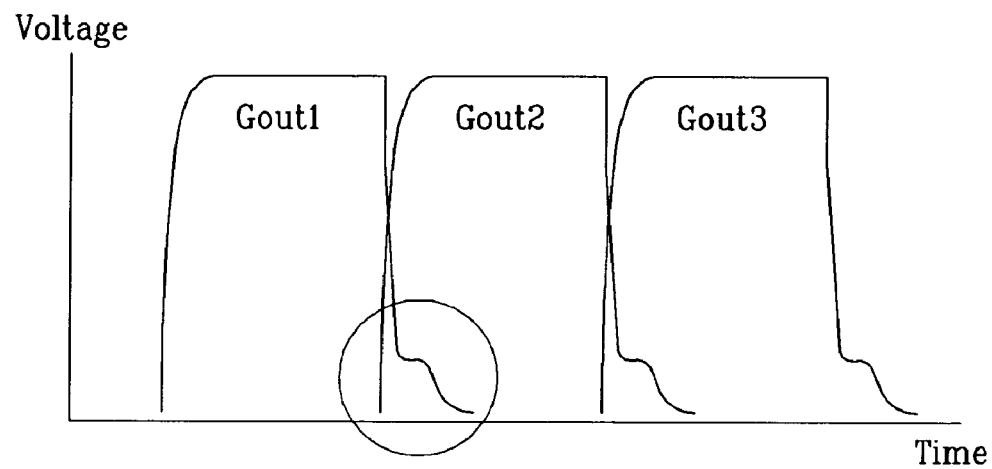
FIGS. 13A and 13B are waveforms to represent gate outputs during a long time driving condition of the gate drivers shown in FIGS. 4 and 7, respectively.
Figure 13B:
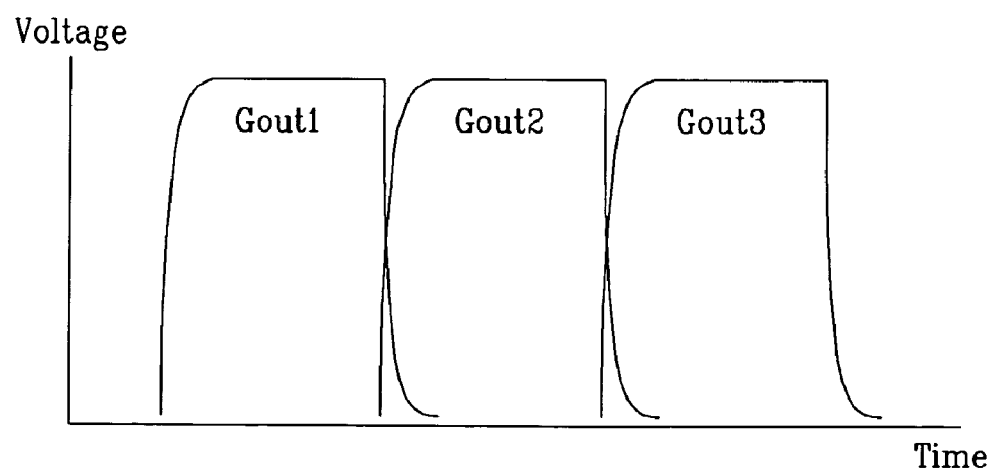

FIGS. 11A and 11B are waveforms showing the gate outputs in the normal state of the gate drivers shown in FIGS. 4 and 7, respectively. FIGS. 12A and 12B are waveforms showing the gate outputs in a low temperature driving condition of the gate drivers shown in FIGS. 4 and 7, respectively. FIGS. 13A and 13B are waveforms showing the gate outputs in a long term driving condition of the gate drivers shown in FIGS. 4 and 7, respectively.

Figure 9B:
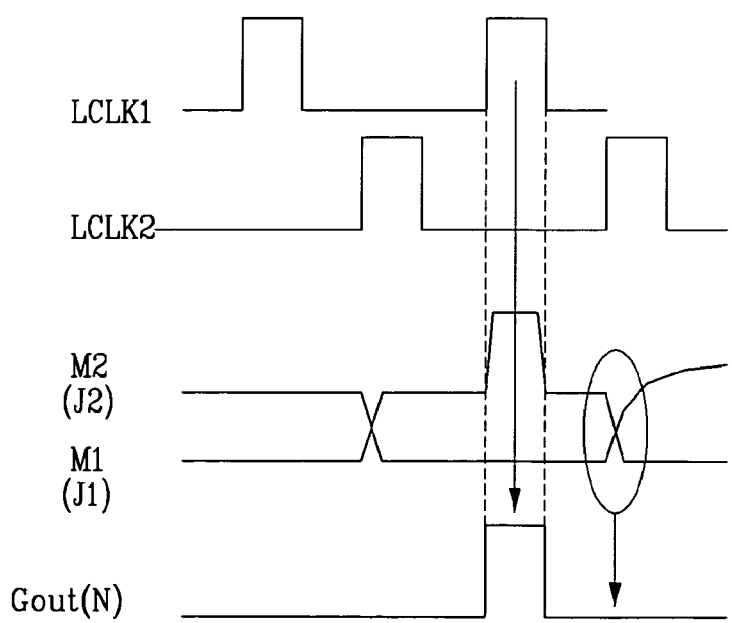

As shown in FIGS. 11A and 11B, while the gate outputs Gout1, Gout2 and Gout3 of the shift register in FIG. 4 are retarded in the falling edges as marked by a circle as described in FIGS. 6B and 9B, the gate outputs Gout1, Gout2 and Gout3 of the shift register in FIG. 7 are not retarded.

The gate outputs Gout1, Gout2 and Gout3 shown in FIGS. 12A and 12B illustrate the low temperature driving condition, which means about 20 degrees below zero.

In this case, in order to display the gate outputs Gout1, Gout2 and Gout3 in the low temperature driving condition, a spice simulation was performed by decreasing drain currents of the transistors M1 and M2 by 30% relative to drain currents of the transistors M1 and M2 at room temperature.

In FIG. 12A, while the magnitudes of the gate outputs Gout1, Gout2 and Gout3 diminish gradually, the gate outputs Gout1, Gout2 and Gout3 have constant magnitudes in FIG. 12B.

Since drain current (for NMOS) or source current (for PMOS) may decrease by 70% relative to drain and source currents at room temperature due to characteristics of a semiconductor comprising a transistor, the driving performance of the transistor decreases by up to 70%. Accordingly, as shown in FIGS. 12A and 12B, the rising time of the gate outputs Gout1, Gout2 and Gout3 increases.

The shift register in FIG. 4 spreads the retardations of the falling edges over next stages to cause an increase in the rising time thereof, as shown in FIG. 12A. Alternatively, the shift register in FIG. 7 has constant amplitudes due to no retardation in the falling edges of the gate outputs Gout1, Gout2 and Gout3 as shown in FIG. 12B. Therefore, a display device having high reliability can be provided in the low temperature driving condition.

Additionally, the gate outputs Gout1, Gout2 and Gout3 shown in FIGS. 13A and 13B illustrate the long term driving condition, which means that, referring back to FIGS. 6B and 9B, the transistor M2 is substantially always turned on except when the clock signal CLK1 is high and for about 2 H (in FIG. 6B) or about 4 H (in FIG. 9B).

The transistor M2 lies in the long term turned-on state, which affects operation characteristics such as an increase of a threshold voltage. Such increase of the threshold voltage is exemplified by an increase of 7V and a spice simulation was performed by increasing the threshold voltage by 7V.

The retardations are more outstanding in the falling edges of the gate outputs Gout1, Gout2 and Gout3 as marked by a circle each of FIGS. 11A, 12A and 13A, but there are no retardations in case of FIGS. 11B, 12B and 13B.

Since, in the NMOS or PMOS transistor, an increase of the threshold voltage increases the magnitude of the gate voltage required for turning on the transistor, the time to reach the threshold voltage becomes longer. Accordingly, as described above, time when the gate and carry output terminals OUT1 and OUT2 lie in the floating state becomes longer such that the retardation increases more as shown in FIG. 13A. Alternatively, in the embodiment in FIG. 7, there is no change of the voltages of the outputs Cout(N) and Gout(N) before and after the floating state, thereby generating constant gate outputs.

On the other hand, in the embodiment in FIG. 7, since the two clock signals CLK1 and CLK2 have the duty ratio of 25% and the phase difference of 180 degrees, power consumption may be reduced. This will be described with reference to FIG. 14.

Figure 14:
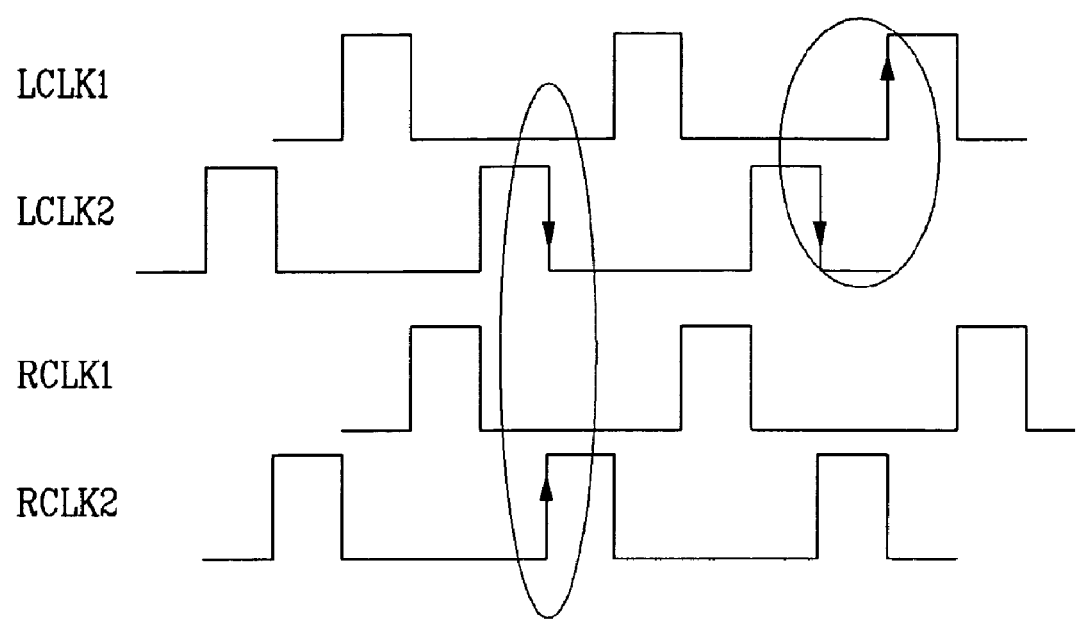
FIG. 14 is a timing chart of the clock signals of the gate driver shown in FIG. 7.

FIG. 14 is a timing chart of the clock signals of the shift register shown in FIG. 7.

The first and the third clock signals LCLK1 and LCLK2 are applied to the left shift register 400L and the second and the fourth clock signals RCLK1 and RCLK2 are applied to the right shift register 400R are shown in FIG. 14.

As shown in FIG. 14, the first clock signal LCLK1 falls when the second clock signal RCLK 1 rises and the third clock signal LCLK2 falls when the fourth clock signal RCLK2 rises. Thus, each of the first to fourth clock signals LCLK1, RCLK1, LCLK2 and RCLK2 have a phase difference of 90 degrees, sequentially. Therefore, the correspondence between falling edges and rising edges causes average power to be zero to minimize power consumption. Likewise, the correspondence between the first and second clock signals LCLK1 and RCLK1 or the third and fourth clock signals LCLK2 and RCLK2 applied to each different shift register in the embodiment in FIG. 7 causes power consumption to be same as power consumption in the embodiment in FIG. 4.

Additionally, although adding an additional shift register to the opposite side of the display device as shown in FIG. 1 requires three additional signal lines (the vertical synchronization start signal RSTV and the second and fourth clock signals RCLK1 and RCLK2), the chip 33 shown in FIG. 3 provides the additional signal lines with almost no increase to a cost of manufacture.

In addition, although the duty ratio of the first to fourth clock signals LCLK1, RCLK1, LCLK2 and RCLK2 have been described as 25% in the embodiment in FIG. 7, duty ratios thereof, which cause the voltage of the outputs Cout(N) and Gout(N) to remain constant throughout the floating state, are sufficient. For example, when the duty ratio of the first to fourth clock signals LCLK1, RCLK1, LCLK2 and RCLK2 is 50%, the outputs OUT1 and OUT2 throughout the floating state are varied as described referring to the embodiment in FIG. 4. Therefore, the duty ratio is preferably less than about 50%. In other words, if the duty ratio is less than about 50%, the duty ratio may range from about 25% to 50%.

As described above, a duty ratio and a phase difference of two clock signals applied to stages of the left and right shift registers 400L and 400R are 25% and 180 degrees, respectively, thereby providing a driving apparatus for a medium sized or small display device having high reliability by not reducing the outputs even during low temperature operation.

While the present invention has been described in detail with reference to the preferred embodiments, it is to be understood that the invention is not limited to the disclosed embodiments, but, on the contrary, is intended to cover various modifications and equivalent arrangements included within the sprit and scope of the appended claims.

What is claimed is:

1. A shift register comprising a plurality of stages, wherein stages of the plurality of stages are connected to each other and a current stage thereof generates an output signal in response to any one of a plurality of clock signals, wherein each of the stages comprises:
a driving unit which charges to a predetermined voltage in response to one of an output start signal and an output signal of a previous stage, and which generates the output signal in response to any one of the clock signals; and a discharge unit which discharges the predetermined voltage in response to an output signal of a next stage, wherein the driving unit comprises:

an input unit which outputs a first voltage in response to one of the output start signal and an output signal of the previous stage; and an output unit which charges to the first voltage and generates the output signal in response to any one of the clock signals, wherein each of the clock signals having a duty ratio of less than 50% and a different phase from each of the other clock signals, wherein the output signal of the output unit is transmitted to a gate line and the next stage, wherein each of high levels of the clock signals do not overlap each other, and wherein the clock signals for some stages disposed on left side of the panel or the other stages disposed on right side of the panel have high value with a frequency of every 4 horizontal periods.

2. The shift register of claim 1, wherein the discharge unit outputs a second voltage to the output unit in response to the output signal of the next stage to discharge from the first voltage to the second voltage.

3. The shift register of claim 2, wherein the output unit outputs the second voltage as the output signal.

4. The shift register of claim 1, wherein each stage has a set terminal, a reset terminal, a first output terminal and a second output terminal, and the input unit comprises a first switching element connected between the first voltage and a first point of contact and having a control terminal connected to the set terminal, and the output assistant unit comprises:

a second switching element connected between the first voltage and a second point of contact; and a third and a fourth switching elements connected in series between the first voltage and the second voltage, wherein a control terminal of the second switching element is connected to a point of contact between the third and the fourth switching elements, and the discharge unit comprises:

a fifth and a sixth switching elements connected in parallel between the first point of contact and the second voltage; and a seventh and a eighth switching elements connected in parallel between the second point of contact and the second voltage, wherein a control terminal of the fifth switching element is connected to the reset terminal, and a control terminal of the sixth switching element is connected to the second point of contact, and a control terminal of the seventh switching element is connected to the first point of contact, and a control terminal of the eighth switching element is connected to the set terminal, and the output unit comprises:

a ninth switching element, a tenth switching element, an eleventh switching element and a twelfth switching element, the ninth and tenth switching elements being connected in series between the clock terminal and the second voltage, and the eleventh and twelfth switching elements being connected in series between the clock terminal and the second voltage; and a first capacitor and a second capacitor connected between the first point of contact and the first and second output terminals, respectively, wherein control terminals of the ninth and the eleventh switching elements are connected to the first point of contact and control terminals of the tenth and the eleventh switching elements are connected to the second point of contact, wherein the first output terminal is connected to a point of contact between the ninth and tenth switching elements, and the second output terminal is connected to a point of contact between the eleventh and twelfth switching elements.

5. The shift register of claim 4, wherein the first to twelfth switching elements comprise amorphous silicon.

6. The shift register of claim 1, wherein each stage has a set terminal, a reset terminal, a first output terminal and a second output terminal, and the input unit comprises a first switching element connected between the first voltage and a first point of contact and having a control terminal connected to the set terminal, and the output assistant unit comprises:

a second switching element connected between the first voltage and a second point of contact; and a third and a fourth switching elements connected in series between the first voltage and the second voltage, wherein a control terminal of the second switching element is connected to a point of contact between the third and the fourth switching elements, and the discharge unit comprises:

a fifth and a sixth switching elements connected in parallel between the first point of contact and the second voltage; and a seventh and a eighth switching elements connected in parallel between the second point of contact and the second voltage, wherein a control terminal of the fifth switching element is connected to the reset terminal, and a control terminal of the sixth switching element is connected to the second point of contact, and a control terminal of the seventh switching element is connected to the first point of contact, and a control terminal of the eighth switching element is connected to the set terminal, and the output unit comprises:

a ninth switching element, a tenth switching element, an eleventh switching element and a twelfth switching element, the ninth and tenth switching elements being connected in series between the clock terminal and the second voltage, and the eleventh and twelfth switching elements being connected in series between the clock terminal and the second voltage; and a first capacitor and a second capacitor connected between the first point of contact and the first and second output terminals, respectively, wherein control terminals of the ninth and the eleventh switching elements are connected to the first point of contact and control terminals of the tenth and the eleventh switching elements are connected to the second point of contact, wherein the first output terminal is connected to a point of contact between the ninth and tenth switching elements, and the second output terminal is connected to a point of contact between the eleventh and twelfth switching elements.

7. The shift register of claim 6, wherein the first to twelfth switching elements comprise amorphous silicon.

8. A shift register comprising a plurality of stages, wherein some stages of the plurality of stages are disposed on left side of a panel and the other stages of the plurality of stages are disposed on right side of the panel,
wherein each of the stages comprises:
a driving unit which charges to a predetermined voltage in response to one of an output start signal and an output signal of a previous stage, and which generates the output signal in response to any one of the clock signals; and
a discharge unit which discharges the predetermined voltage in response to an output signal of a next stage,
wherein the driving unit comprises:
an input unit which outputs a first voltage in response to one of the output start signal and an output signal of the previous stage; and
an output unit which charges to the first voltage and generates the output signal in response to any one of the clock signals,
wherein some stages disposed on left side of the panel are connected to each other and the other stages disposed on right side of the panel are connected to each other,
wherein each of the clock signals having a duty ratio of less than 50% and a different phase from each of the other clock signals,
wherein some stages disposed on left side of the panel and the other stages disposed on right side of the panel are alternatively connected to gate lines, and
wherein the clock signals for some stages disposed on left side of the panel or the other stages disposed on right side of the panel have high value with a frequency of every 4 horizontal periods.

9. The shift register of claim 8, wherein the discharge unit outputs a second voltage to the output unit in response to the output signal of the next stage to discharge from the first voltage to the second voltage.

10. The shift register of claim 9, wherein the output unit outputs the second voltage as the output signal.

11. The shift register of claim 8, wherein each of high values of the clock signals do not overlap each other.

12. A shift register comprising a plurality of stages, wherein some stages of the plurality of stages are disposed on left side of a panel and the other stages of the plurality of stages are disposed on right side of the panel,
wherein each of the stages comprises:
a driving unit which charges to a predetermined voltage in response to one of an output start signal and an output signal of a previous stage, and which generates the output signal in response to any one of the clock signals; and
a discharge unit which discharges the predetermined voltage in response to an output signal of a next stage,
wherein the driving unit comprises:
an input unit which outputs a first voltage in response to one of the output start signal and an output signal of the previous stage; and
an output unit which charges to the first voltage and generates the output signal in response to any one of the clock signals,
wherein some stages disposed on left side of the panel are connected to each other and the other stages disposed on right side of the panel are connected to each other,
wherein the output signal of the output unit is transmitted to a gate line and the next stage;
wherein some stages disposed on left side of the panel and the other stages disposed on right side of the panel are alternatively connected to gate lines, and
wherein the clock signals for some stages disposed on left side of the panel or the other stages disposed on right side of the panel have high value with a frequency of every 4 horizontal periods.

13. The shift register of claim 12, wherein the discharge unit outputs a second voltage to the output unit in response to the output signal of the next stage to discharge from the first voltage to the second voltage.

14. The shift register of claim 12, wherein the output unit outputs the second voltage as the output signal.

15. A shift register comprising a plurality of stages, wherein some stages of the plurality of stages are disposed on left side of a panel and the other stages of the plurality of stages are disposed on right side of the panel,
wherein each of the stages comprises:
a driving unit which charges to a predetermined voltage in response to one of an output start signal and an output signal of a previous stage, and which generates the output signal in response to any one of the clock signals; and
a discharge unit which discharges the predetermined voltage in response to an output signal of a next stage,
wherein the driving unit comprises:
an input unit which outputs a first voltage in response to one of the output start signal and an output signal of the previous stage; and
an output unit which charges to the first voltage and generates the output signal in response to any one of the clock signals,
wherein some stages disposed on left side of the panel and the other stages disposed on right side of the panel are alternatively connected to gate lines,
wherein each of the clock signals having a duty ratio of less than 50% and a different phase from each of the other clock signals,
wherein the output signal of the output unit is transmitted to a gate line and the next stage, and
wherein the clock signals for some stages disposed on left side of the panel or the other stages disposed on right side of the panel have high value with a frequency of every 4 horizontal periods.

16. The shift register of claim 15, wherein some stages disposed on left side of the panel and the other stages disposed on right side of the panel are alternatively connected to gate lines.

17. A shift register comprising a plurality of stages, wherein stages of the plurality of stages are connected to each other and a current (N-th) stage thereof generates an output signal in response to any one of a plurality of clock signals and an output from each of two different stages thereof, each of the clock signals having a duty ratio of less than 50% and a different phase from each of the other clock signals,
wherein each of the stages comprises:
a driving unit which charges to a predetermined voltage in response to one of an output start signal and an output signal of a previous stage, the previous stage being disposed two stages previous (N−2) to the current stage, and which generates the output signal in response to any one of the clock signals; and a discharge unit which discharges the predetermined voltage in response to an output signal of a next stage, the next stage being disposed two stages after (N+2) the current stage, wherein the driving unit comprises:

an input unit which outputs a first voltage in response to one of the output start signal and an output signal of the previous (N−2) stage; and an output unit which charges to the first voltage and generates the output signal in response to any one of the clock signals, wherein the output unit comprises two output circuits having substantially a same structure, and wherein each of the stages further comprises an output assistant unit transmitting the first voltage to the output unit in response to an output of the input unit.

18. The shift register of claim 17, wherein the discharge unit outputs a second voltage to the output unit in response to the output signal of the next (N+2) stage to discharge from the first voltage to the second voltage.

19. The shift register of claim 18, wherein the output unit outputs the second voltage as the output signal.

20. The shift register of claim 17, wherein each stage has a set terminal, a reset terminal, a first output terminal and a second output terminal, and the input unit comprises a first switching element connected between the first voltage and a first point of contact and having a control terminal connected to the set terminal, and the output assistant unit comprises:

a second switching element connected between the first voltage and a second point of contact; and a third and a fourth switching elements connected in series between the first voltage and the second voltage, wherein a control terminal of the second switching element is connected to a point of contact between the third and the fourth switching elements, and the discharge unit comprises:

a fifth and a sixth switching elements connected in parallel between the first point of contact and the second voltage; and a seventh and a eighth switching elements connected in parallel between the second point of contact and the second voltage, wherein a control terminal of the fifth switching element is connected to the reset terminal, and a control terminal of the sixth switching element is connected to the second point of contact, and a control terminal of the seventh switching element is connected to the first point of contact, and a control terminal of the eighth switching element is connected to the set terminal, and the output unit comprises:

a ninth switching element, a tenth switching element, an eleventh switching element and a twelfth switching element, the ninth and tenth switching elements being connected in series between the clock terminal and the second voltage, and the eleventh and twelfth switching elements being connected in series between the clock terminal and the second voltage; and a first capacitor and a second capacitor connected between the first point of contact and the first and second output terminals, respectively, wherein control terminals of the ninth and the eleventh switching elements are connected to the first point of contact and control terminals of the tenth and the eleventh switching elements are connected to the second point of contact, wherein the first output terminal is connected to a point of contact between the ninth and tenth switching elements, and the second output terminal is connected to a point of contact between the eleventh and twelfth switching elements.

21. The shift register of claim 20, wherein the first to twelfth switching elements comprise amorphous silicon.

* * * * *